(12) United States Patent
Kim et al.

(10) Patent No.: US 11,195,950 B2
(45) Date of Patent: Dec. 7, 2021

(54) SEMICONDUCTOR DEVICE WITH AT LEAST A PORTION OF GATE ELECTRODE ENCLOSED BY AN INSULATING STRUCTURE AND METHOD OF FABRICATING THE SAME

(71) Applicant: Samsung Electronics Co., Ltd., Suwon-si (KR)

(72) Inventors: Kyujin Kim, Seoul (KR); Hui-Jung Kim, Seongnam-si (KR); Junsoo Kim, Seongnam-si (KR); Sangho Lee, Hwaseong-si (KR); Jae-Hwan Cho, Suwon-si (KR); Yoosang Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/722,622

(22) Filed: Dec. 20, 2019

(65) Prior Publication Data

US 2021/0005506 A1 Jan. 7, 2021

(30) Foreign Application Priority Data

Jul. 2, 2019 (KR) ........................ 10-2019-0079528

(51) Int. Cl.
| | |
|---|---|
| *H01L 29/78* | (2006.01) |
| *H01L 21/762* | (2006.01) |
| *H01L 21/311* | (2006.01) |
| *H01L 27/108* | (2006.01) |
| *H01L 29/66* | (2006.01) |

(Continued)

(52) U.S. Cl.
CPC ........ *H01L 29/7827* (2013.01); *H01L 21/311* (2013.01); *H01L 21/7621* (2013.01); *H01L 21/76224* (2013.01); *H01L 21/823481* (2013.01); *H01L 27/10876* (2013.01); *H01L 29/4232* (2013.01); *H01L 29/66621* (2013.01)

(58) Field of Classification Search
CPC ............ H01L 27/0886; H01L 27/0924; H01L 27/10826; H01L 27/10879; H01L 27/1211; H01L 29/7851; H01L 29/4236; H01L 27/10823; H01L 27/10876
See application file for complete search history.

(56) References Cited

U.S. PATENT DOCUMENTS

| | | |
|---|---|---|
| 8,012,833 B2 | 9/2011 | Im |
| 8,338,246 B2 | 12/2012 | Im |

(Continued)

FOREIGN PATENT DOCUMENTS

| | | |
|---|---|---|
| KR | 100869352 B1 | 11/2008 |
| KR | 100876893 B1 | 1/2009 |

*Primary Examiner* — Scott B Geyer
(74) *Attorney, Agent, or Firm* — Harness, Dickey & Pierce, P.L.C.

(57) ABSTRACT

A semiconductor device may include active patterns extended in a first direction and spaced apart from each other in the first direction, a device isolation layer defining the active patterns, an insulating structure provided between the active patterns and between the device isolation layer, and a gate structure disposed on the insulating structure and extended in a second direction crossing the first direction. The gate structure may include an upper portion and a lower portion. The lower portion of the gate structure may be enclosed by the insulating structure.

14 Claims, 44 Drawing Sheets

(51) Int. Cl.
*H01L 29/423* (2006.01)
*H01L 21/8234* (2006.01)

(56) References Cited

U.S. PATENT DOCUMENTS

| | | |
|---|---|---|
| 8,357,578 B2 | 1/2013 | Kim |
| 8,835,280 B1 | 9/2014 | Ryu |
| 8,987,111 B2 | 3/2015 | Choi et al. |
| 9,012,321 B1 | 4/2015 | Kim et al. |
| 9,214,348 B2 | 12/2015 | Son et al. |
| 9,356,029 B2 * | 5/2016 | Oh ................... H01L 21/32133 |
| 9,558,990 B2 | 1/2017 | Min |
| 9,768,177 B2 | 9/2017 | Nobuto |
| 10,211,086 B2 | 2/2019 | Nagai |
| 2004/0150037 A1 * | 8/2004 | Katsumata ........ H01L 27/10876 257/330 |
| 2007/0138599 A1 * | 6/2007 | Ahn ................... H01L 27/10879 257/618 |
| 2009/0224312 A1 * | 9/2009 | Taketani ................ H01L 27/24 257/330 |
| 2011/0006365 A1 * | 1/2011 | Ananthan ........... H01L 29/4236 257/330 |
| 2012/0132971 A1 * | 5/2012 | Mikasa ............. H01L 27/10814 257/296 |
| 2012/0161227 A1 * | 6/2012 | Oyu ................. H01L 27/10891 257/330 |
| 2012/0187412 A1 * | 7/2012 | D'Evelyn ........... H01L 21/6835 257/76 |
| 2014/0110786 A1 * | 4/2014 | Kim .................... H01L 29/4236 257/365 |
| 2014/0120691 A1 * | 5/2014 | Lee .................. H01L 21/76229 438/400 |
| 2015/0228786 A1 | 8/2015 | Yi et al. |
| 2016/0307890 A1 * | 10/2016 | Yeo ................... H01L 29/66795 |
| 2016/0308030 A1 * | 10/2016 | Song ................. H01L 29/0649 |
| 2016/0336414 A1 * | 11/2016 | Kang ............... H01L 29/66621 |
| 2018/0342518 A1 * | 11/2018 | Kim ................. H01L 27/10879 |
| 2019/0221669 A1 * | 7/2019 | Lee ................. H01L 21/823431 |
| 2019/0259673 A1 * | 8/2019 | Liu ................... H01L 29/66795 |
| 2019/0326297 A1 * | 10/2019 | Ujihara ................ H01L 29/165 |
| 2020/0343362 A1 * | 10/2020 | Wu ................. H01L 21/823418 |

* cited by examiner

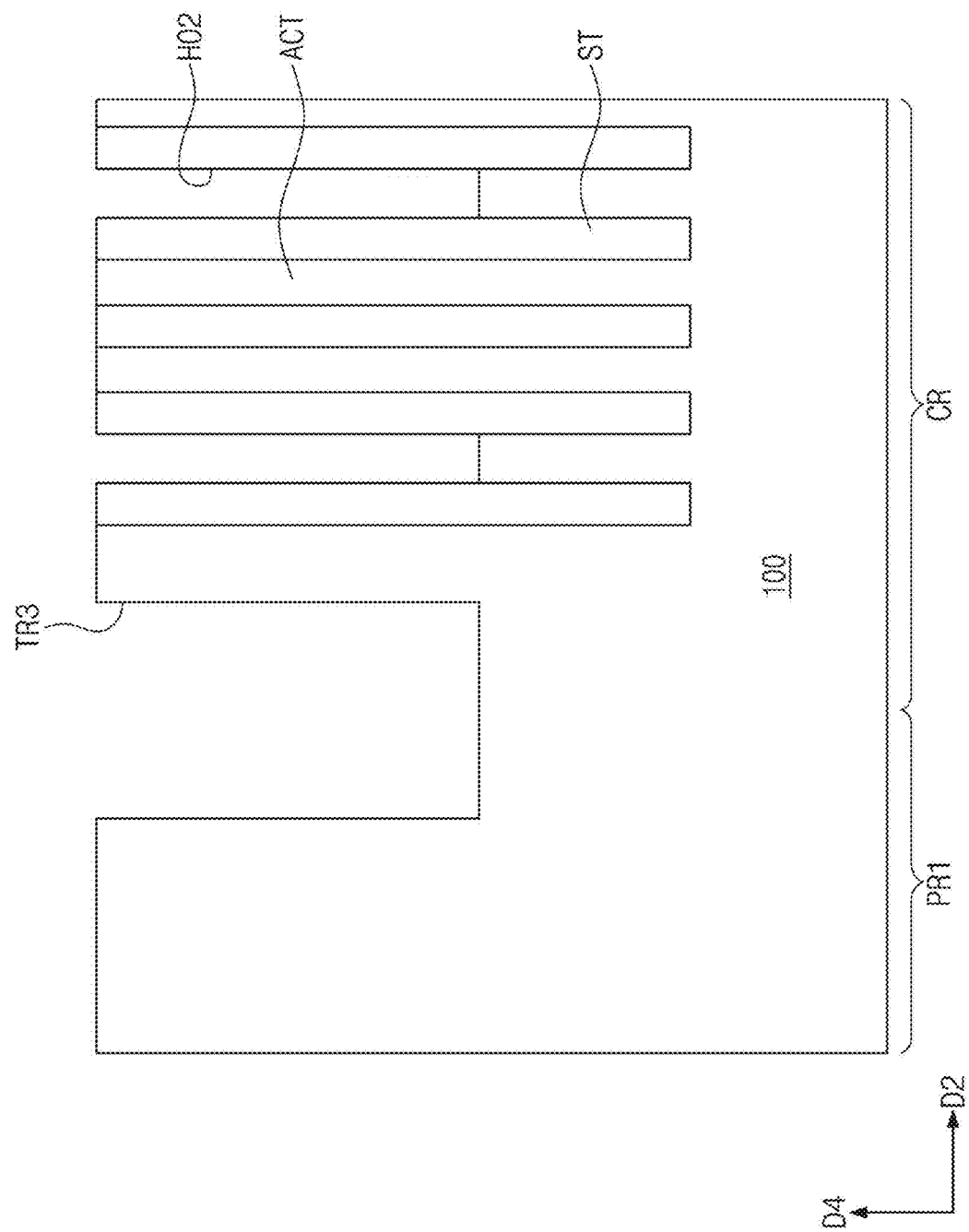

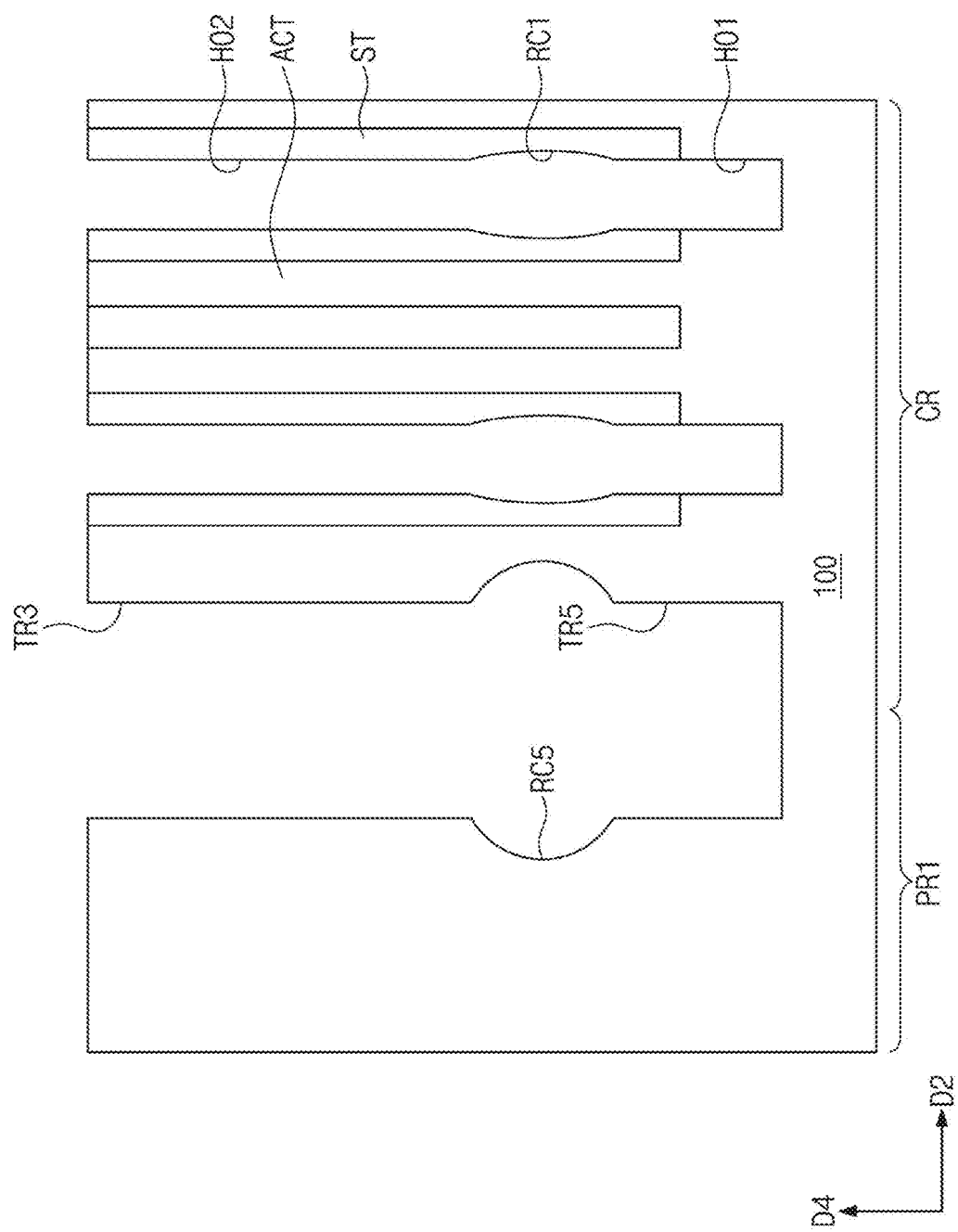

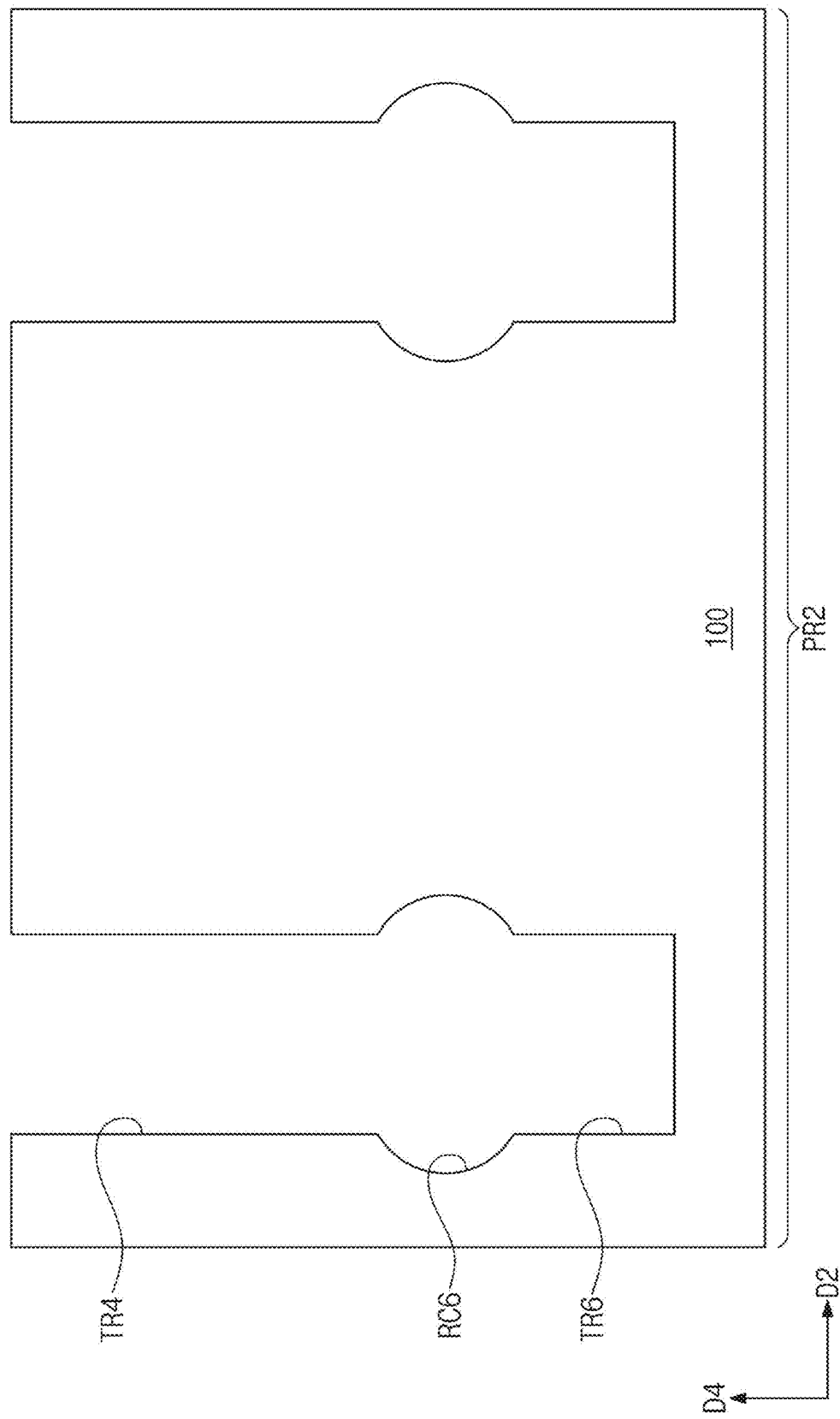

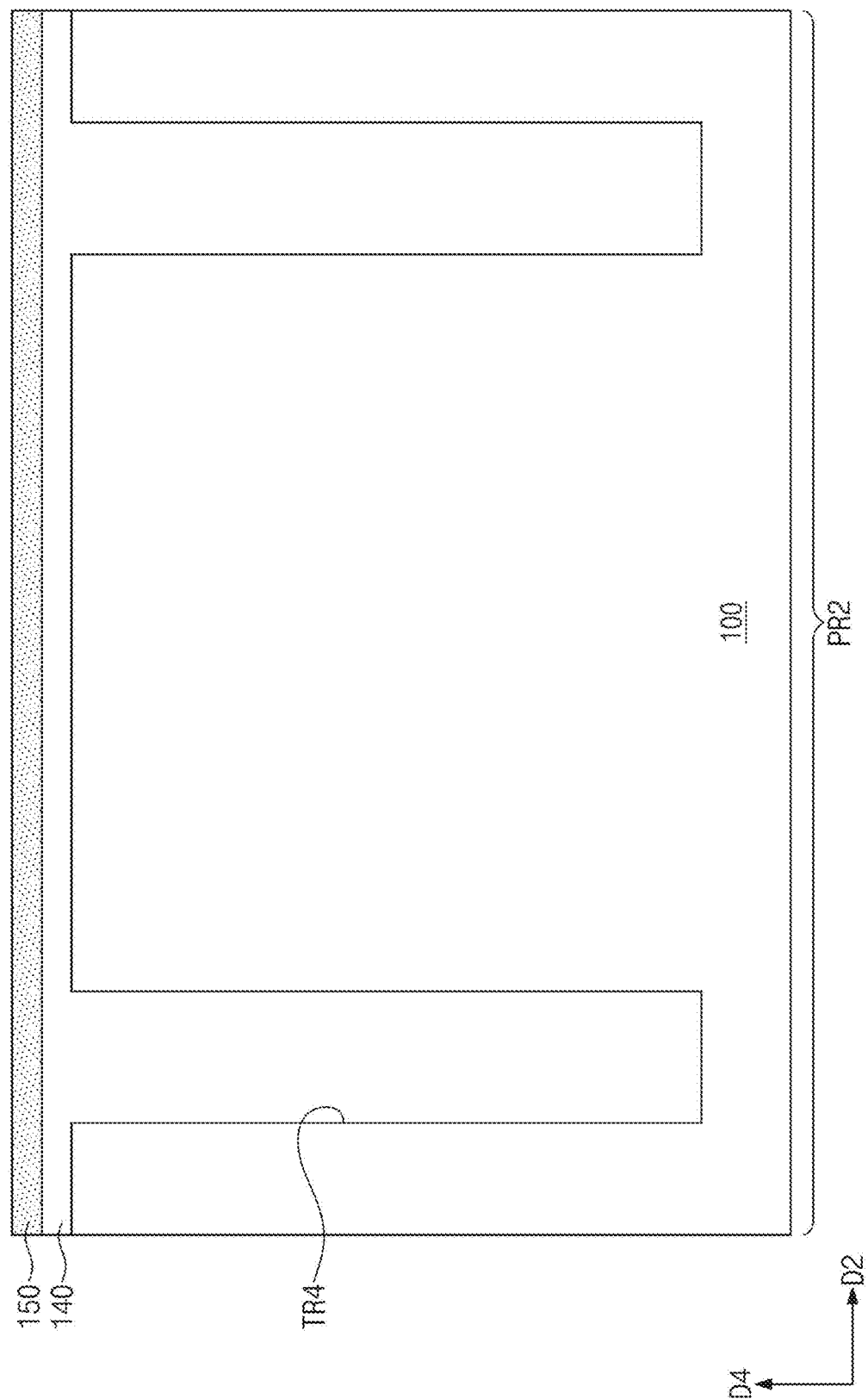

SEMICONDUCTOR DEVICE WITH AT LEAST A PORTION OF GATE ELECTRODE ENCLOSED BY AN INSULATING STRUCTURE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2019-0079528, filed on Jul. 2, 2019, in the Korean Intellectual Property Office, the entire contents of which are hereby incorporated by reference.

BACKGROUND

Example embodiments relate to a semiconductor device and/or a method of fabricating the same. For example, at least some example embodiments relate to a semiconductor device including an insulating structure and/or a method of fabricating the same.

Due to their small-size, multifunctionality, and/or low-cost characteristics, semiconductor devices are important elements in the electronic industry. Generally, semiconductor devices are classified into a memory device for storing data, a logic device for processing data, and a hybrid device for performing various functions.

As the electronic industry advances, there is an increasing demand for a semiconductor device with a higher integration density and higher performance. To meet such a demand, it is helpful to reduce a process margin (e.g., in a photolithography process). The reduction of the process margin may lead to several difficulties in fabricating a semiconductor device.

SUMMARY

Example embodiments of the inventive concepts provide a semiconductor device with improved electric characteristics.

According to an example embodiment of the inventive concepts, a semiconductor device may include active patterns extending in a first direction such that the active patterns are spaced apart from each other in the first direction; a device isolation layer defining the active patterns; an insulating structure between each of the active patterns and between the device isolation layer; and a gate structure on the insulating structure and extending in a second direction, the second direction crossing the first direction, the gate structure including an upper portion and a lower portion, the lower portion of the gate structure being enclosed by the insulating structure.

According to an example embodiment of the inventive concepts, a semiconductor device may include active patterns extending in a first direction such that the active patterns are spaced apart from each other in the first direction, the active patterns each including a first impurity region and second impurity regions, the second impurity regions spaced apart from each other in the first direction with the first impurity region interposed therebetween; a device isolation layer defining the active patterns; an insulating structure between each of the active patterns and between the device isolation layer; a gate structure on the insulating structure and extending in a second direction, the second direction crossing the first direction, the gate structure including an upper portion and a lower portion, the lower portion of the gate structure in the insulating structure; a bit line connected to the first impurity region and extending in a third direction, the third direction crossing the first and second directions; and contacts each connected to a respective one of the second impurity regions.

According to an example embodiment of the inventive concepts, a method of fabricating a semiconductor device may include forming a device isolation layer in a substrate; forming a first hole between the device isolation layer to form an active pattern extending in a first direction; forming a first recess below the first hole; increasing a size of the first recess to form a second recess; forming an insulating structure in the second recess; forming a third recess in the insulating structure; increasing a size of the third recess to form a fourth recess; and forming a gate structure that fills the fourth recess and extends in a second direction, the second direction crossing the first direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 13A, 13B, 13C, 14A, 14B, 14C, 15A, 15B, 15C, 16A, 16B, and 16C are sectional views illustrating a method of fabricating the semiconductor device of FIG. 12.

FIGS. 17A, 17B, 17C, 18A, 18B, and 18C are sectional views illustrating a method of fabricating the semiconductor device of FIG. 12.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1A:
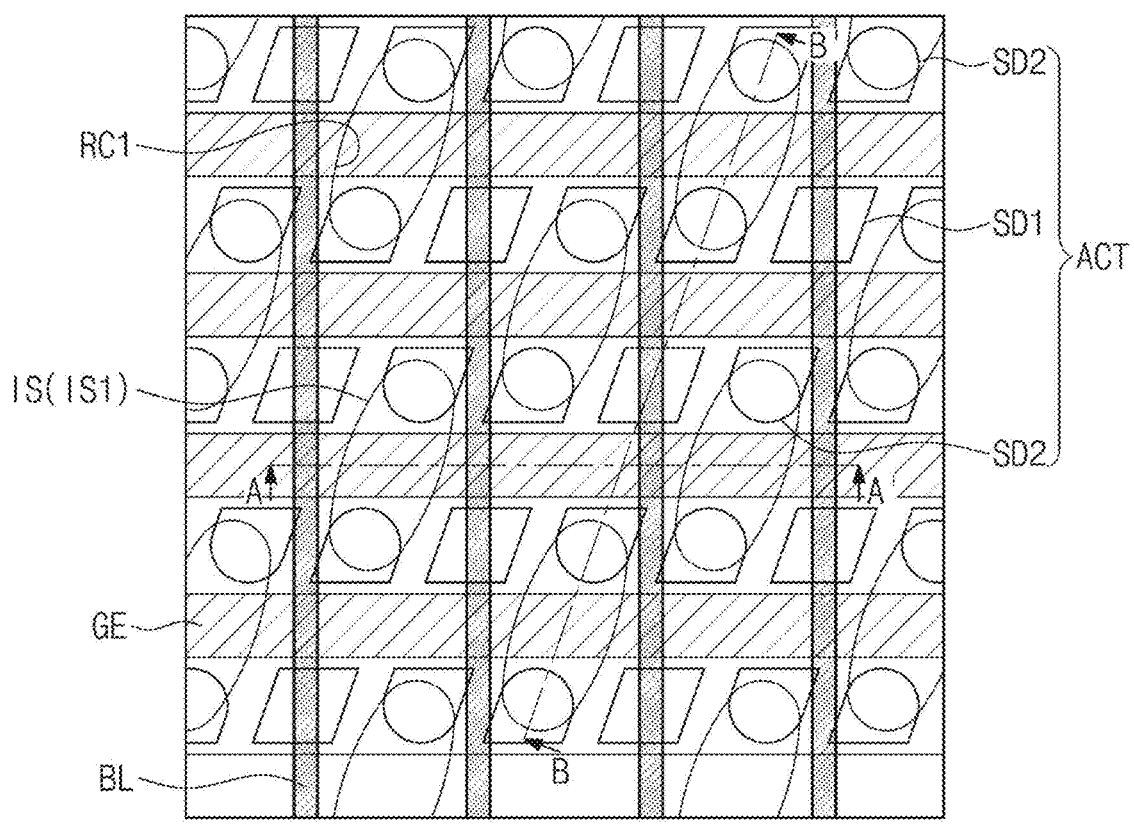
FIG. 1A is a plan view illustrating a semiconductor device according to an example embodiment of the inventive concepts.
Figure 1A:
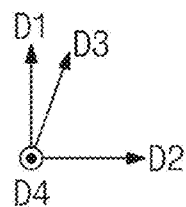
Figure 1B:
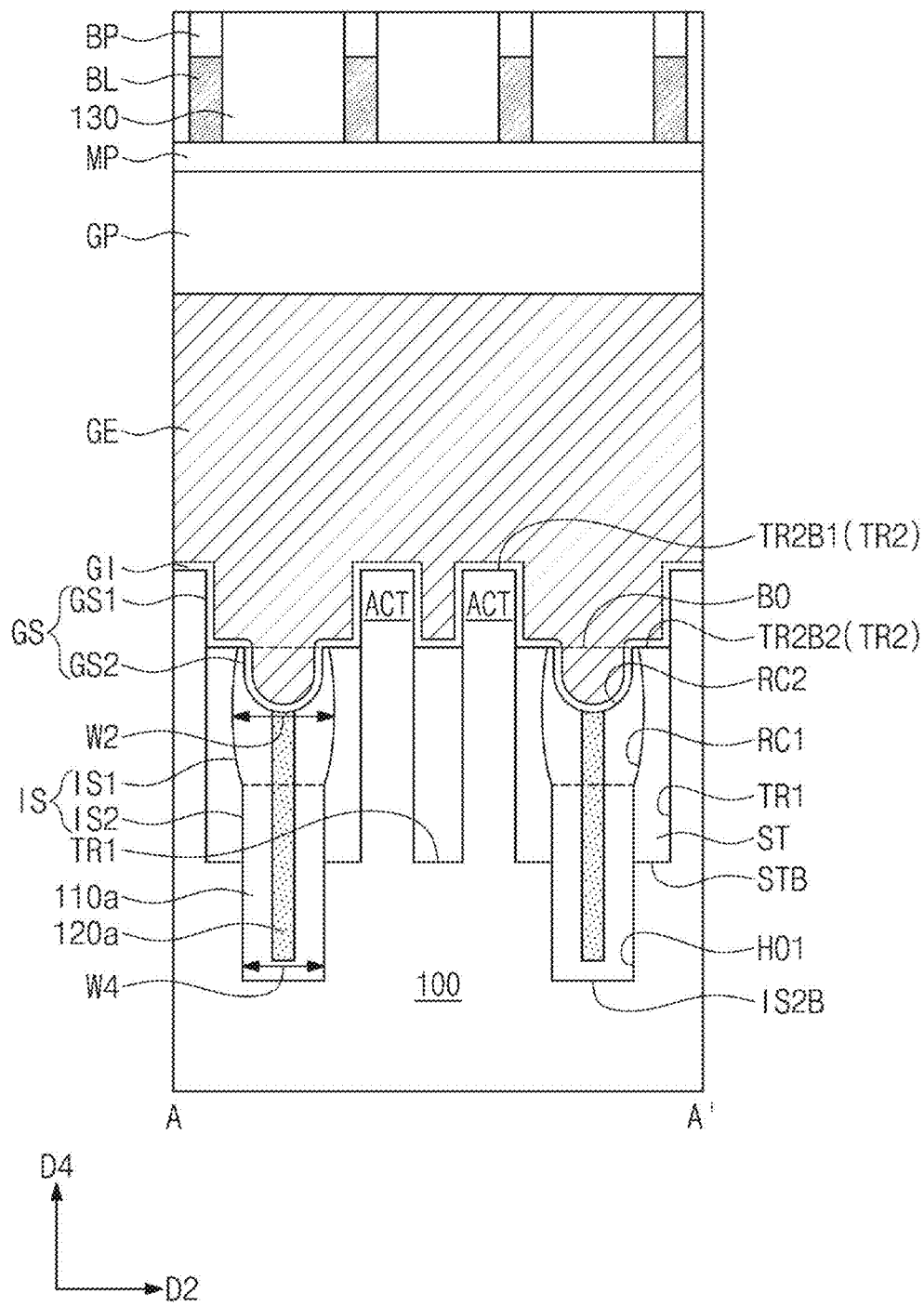
FIGS. 1B and 1C are sectional views taken along lines A-A' and B-B', respectively, of FIG. 1A.
Figure 1C:
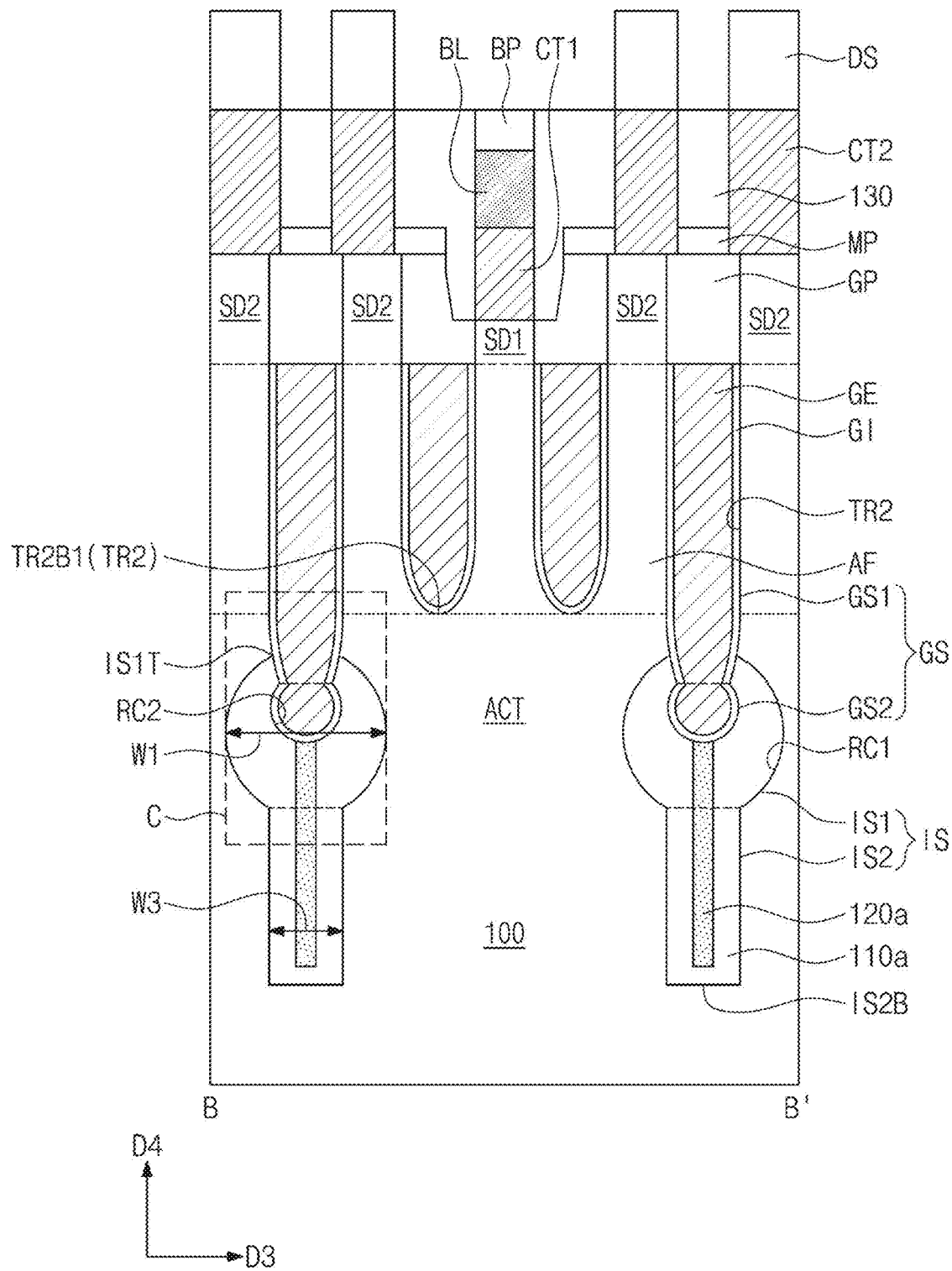
Figure 1D:
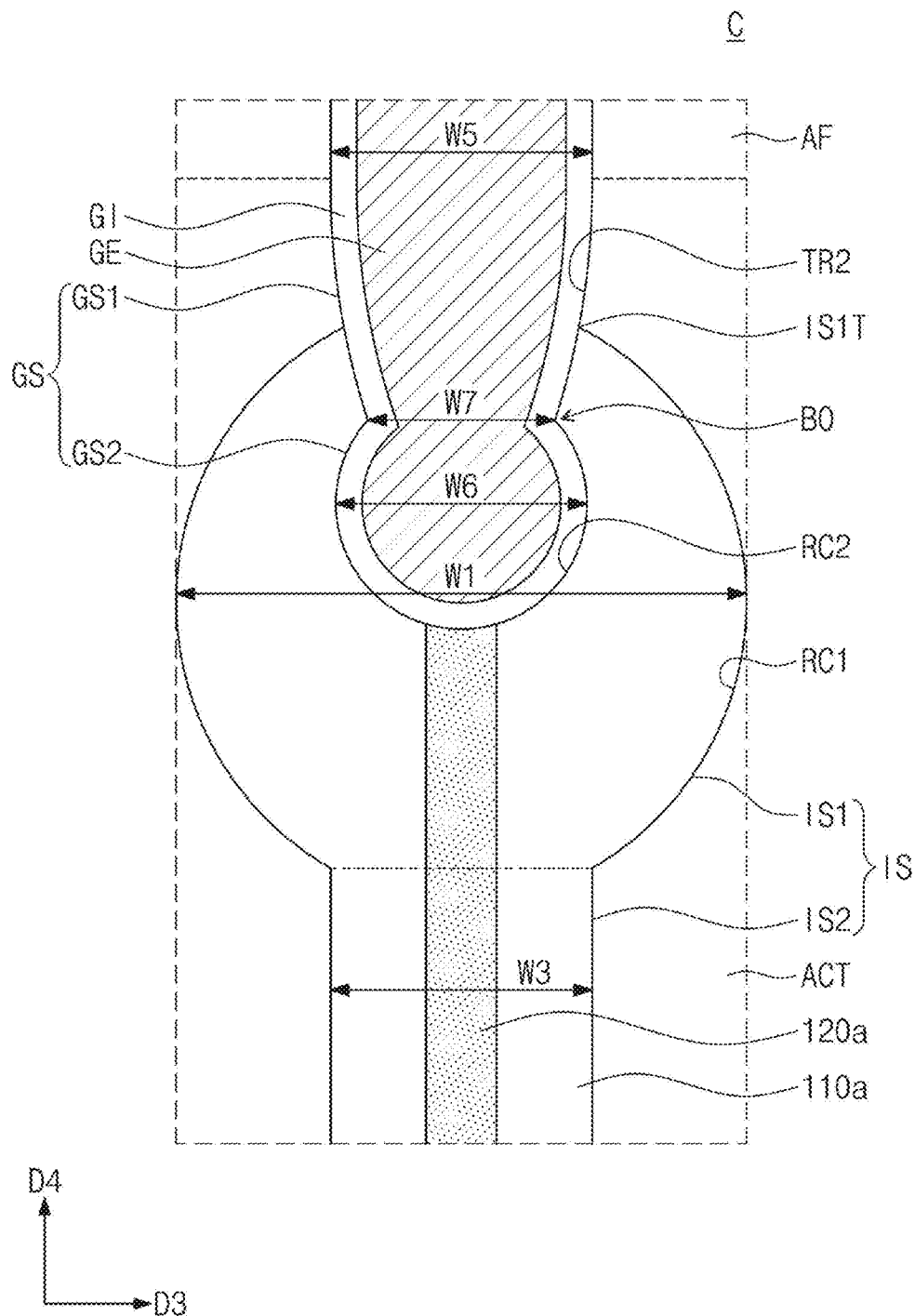
FIG. 1D is an enlarged view of a portion 'C' of FIG. 1C.

FIG. 1A is a plan view illustrating a semiconductor device according to an example embodiment of the inventive concepts. FIGS. 1B and 1C are sectional views taken along lines A-A' and B-B', respectively, of FIG. 1A. FIG. 1D is an enlarged view of a portion 'C' of FIG. 1C.

Referring to FIGS. 1A, 1B, 1C, and 1D, a semiconductor device may include a substrate 100 and a device isolation layer ST provided in the substrate 100. The device isolation layer ST may fill first trenches TR1, which are defined in the substrate 100. The first trenches TR1 may be extended in a third direction D3. The third direction D3 may be parallel to a top surface of the substrate 100.

The device isolation layer ST may be formed of or include silicon oxide. The substrate 100 may be a semiconductor substrate, which includes silicon, germanium, or silicon-germanium.

Insulating structures IS may be provided between the device isolation layer ST. Each of the insulating structures IS may include a first portion IS1 and a second portion IS2. The second portion IS2 may be provided below the first portion IS1. In other words, an upper portion of the insulating structure IS may be the first portion IS1, and a lower portion of the insulating structure IS may be the second portion IS2. The first portion IS1 may be a portion filling a first recess RC1 formed in the substrate 100, and the second portion IS2 may be a portion filling a first hole HO1 formed below the first recess RC1. A bottom level of the first hole HO1 may be lower than a bottom level of the first trench TR1. In other words, a level of a lowermost portion IS2B of the second portion IS2 of the insulating structure IS may be lower than a level of a lowermost portion STB of the device isolation layer ST.

A largest width of the first portion IS1 in the third direction D3 may be defined as a first width W1. A largest width of the first portion IS1 in a second direction D2 may be defined as a second width W2. The second direction D2 may be a direction, which is parallel to the top surface of the substrate 100 and crosses the third direction D3. A largest width of the second portion IS2 in the third direction D3 may be defined as a third width W3. A width of the second portion IS2 in the second direction D2 may be defined as a fourth width W4.

The first width W1 may be greater than the second width W2. The first width W1 may be greater than the third width W3. The second width W2 may be greater than the fourth width W4.

A width of the first portion IS1 in the third direction D3 may increase from its top portion to its middle portion and may decrease from its middle portion to its bottom portion. A width of the first portion IS1 in the second direction D2 may increase from its top portion to its middle portion and may decrease from its middle portion to its bottom portion.

The insulating structure IS may include a first insulating pattern 110a and a second insulating pattern 120a. The second insulating pattern 120a may be extended from a center portion of the insulating structure IS in a fourth direction D4. The fourth direction D4 may be perpendicular to the top surface of the substrate 100. The first insulating pattern 110a may enclose the second insulating pattern 120a. The first insulating pattern 110a and the second insulating pattern 120a may include materials different from each other. As an example, the first insulating pattern 110a may be formed of or include silicon oxide, and the second insulating pattern 120a may be formed of or include silicon nitride.

A second recess RC2 may be defined in the first portion IS1 of the insulating structure IS. The second recess RC2 may be provided in the first recess RC1. The second recess RC2 may be formed by recessing a top surface of the first portion IS1 of the insulating structure IS.

Active patterns ACT may be defined by the insulating structures IS and the device isolation layer ST. The active patterns ACT may be extended in the third direction D3. A pair of the active patterns ACT, which are adjacent to each other, may be spaced apart from each other, in the third direction D3, with the insulating structure IS interposed therebetween. The active patterns ACT may be two-dimensionally arranged. Since the insulating structure IS is provided between the active patterns ACT, electric characteristics of a semiconductor device according to example embodiments may be improved.

Each of the active patterns ACT may include a first impurity region SD1 and a pair of second impurity regions SD2. The pair of the second impurity regions SD2 may be spaced apart from each other with the first impurity region SD1 interposed therebetween in the third direction D3. The first and second impurity regions SD1 and SD2 may have the same conductivity type (e.g., N type).

Second trenches TR2 may be defined on the insulating structures IS, the device isolation layer ST, and the active patterns ACT. The second trenches TR2 may be extended in the second direction D2. The second trenches TR2 may be arranged in a first direction D1. The first direction D1 may be a direction that is parallel to the top surface of the substrate 100 and is perpendicular to the second direction D2. The second trenches TR2 may be connected to the second recesses RC2 in the first portion IS1 of the insulating structure IS. The second recess RC2 may be connected to a bottom of the second trench TR2.

Each of the second trenches TR2 may include first bottoms TR2B1 and second bottoms TR2B2. The first bottom TR2B1 may be defined by the active pattern ACT. The second bottom TR2B2 may be defined by the insulating structure IS and the device isolation layer ST. A level of the first bottom TR2B1 may be higher than a level of the second bottom TR2B2.

Portions of the active pattern ACT, which are located at a level higher the first bottom TR2B1 of the second trench TR2, may be defined as active fins AF. Each of the active patterns ACT may include the active fins AF, which are spaced apart from each other in the third direction D3. The first impurity region SD1 or the second impurity region SD2 may be provided in or on an upper portion of each of the active fins AF.

A level of the lowermost portion of the active fin AF may be substantially equal to a level of the first bottom TR2B1 of the second trench TR2. A level of the lowermost portion of the active fin AF may be higher than a level of an uppermost portion IS1T of the first portion IS1 of the insulating structure IS. Since the lowermost portion of the active fin AF is spaced apart from the first portion IS1 of the insulating structure IS, electric characteristics of the semiconductor device according to example embodiments may be improved.

Gate structures GS may be provided to fill the second trenches TR2 and the second recesses RC2. The gate structures GS may be extended in the second direction D2. The gate structures GS may be arranged in the first direction D1. Each of the gate structures GS may include an upper portion GS1 filling the second trench TR2 and lower portions GS2 filling the second recesses RC2.

The lower portion GS2 of the gate structure GS may be enclosed by the first portion IS1 of the insulating structure IS, when viewed in a plan view. In other words, the lower portion GS2 of the gate structure GS may be provided in the first portion IS1 of the insulating structure IS. The second insulating pattern 120a of the insulating structure IS may be extended from the lower portion GS2 of the gate structure GS toward a bottom of the first hole HO1 downwardly. As such, the insulating structure IS between actives patterns ACT may be formed below the gate electrode GE with a portion GS2 of the gate electrode GE provided in the recess RC2 formed in a top surface of the first portion IS1 of the insulating structure IS such that the insulating structure IS encloses the gate electrode GE.

A largest width of the upper portion GS1 of the gate structure GS in the third direction D3 may be defined as a fifth width W5. A largest width of the lower portion GS2 of the gate structure GS in the third direction D3 may be defined as a sixth width W6. A width, in the third direction D3, of a border BO between the upper and lower portions GS1 and GS2 of the gate structure GS may be defined as a seventh width W7.

The fifth width W5 and the sixth width W6 may be greater than the seventh width W7. The fifth width W5 and the sixth width W6 may be smaller than the first width W1.

A level of the border BO between the upper and lower portions GS1 and GS2 of the gate structure GS may be lower than a level of the uppermost portion IS1T of the first portion IS1 of the insulating structure IS. A level of the border BO between the upper and lower portions GS1 and GS2 of the gate structure GS may be substantially equal to a level of the second bottom TR2B2 of the second trench TR2.

Each of the gate structures GS may include a gate electrode GE and a gate dielectric layer GI. The gate dielectric layer GI may conformally cover the second trench TR2 and the second recess RC2, and the gate electrode GE may be provided on the gate dielectric layer GI.

The gate dielectric layer GI may include a silicon oxide layer, a silicon nitride layer, a silicon oxynitride layer, and/or a high-k dielectric layer. In an example embodiment, the high-k dielectric layer may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or any combination thereof.

The gate electrode GE may include at least one of conductive metal nitrides (e.g., titanium nitride or tantalum nitride) or metallic materials (e.g., titanium, tantalum, tungsten, copper, or aluminum).

A gate capping layer GP may be provided on each of the gate structures GS. A top surface of the gate capping layer GP may be coplanar with top surfaces of the first and second impurity regions SD1 and SD2 of the active pattern ACT.

The gate capping layer GP may include a silicon oxide layer, a silicon nitride layer, and/or a silicon oxynitride layer.

A mask pattern MP may be formed on the gate capping layers GP and the active patterns ACT. The mask pattern MP may include a plurality of insulating layers. The insulating layers may include a silicon oxide layer, a silicon nitride layer, or a poly silicon layer.

First contacts CT1 may be provided on the first impurity regions SD1 of the active patterns ACT. The first contacts CT1 may be provided to penetrate the mask pattern MP. The first contacts CT1 may include at least one of conductive metal nitrides (e.g., titanium nitride or tantalum nitride) or metallic materials (e.g., titanium, tantalum, tungsten, copper, or aluminum).

Bit lines BL may be provided on the first contacts CT1. The bit lines BL may be extended in the first direction D1. The bit lines BL may be arranged in the second direction D2.

Bit line capping layers BP may be provided on the bit lines BL. The bit line capping layers BP may be extended in the first direction D1. The bit line capping layers BP may be arranged in the second direction D2.

The bit line capping layers BP may be formed of or include at least one of silicon nitride, silicon oxide, or silicon oxynitride.

An interlayered insulating pattern 130 may be provided on the mask pattern MP and the active patterns ACT. The interlayered insulating pattern 130 may be formed of or include silicon oxide.

Second contacts CT2 may be provided to penetrate the interlayered insulating pattern 130 and may be connected to the second impurity regions SD2. The second contacts CT2 may include at least one of conductive metal nitrides (e.g., titanium nitride or tantalum nitride) or metallic materials (e.g., titanium, tantalum, tungsten, copper, or aluminum).

Data storing elements DS may be provided to be connected to the second contacts CT2, respectively. The data storing elements DS may be memory elements including a capacitor, a magnetic tunnel junction pattern, a phase change material, or a variable resistance material. In an example embodiment, the data storing element DS may be a capacitor.

Figure 2A:
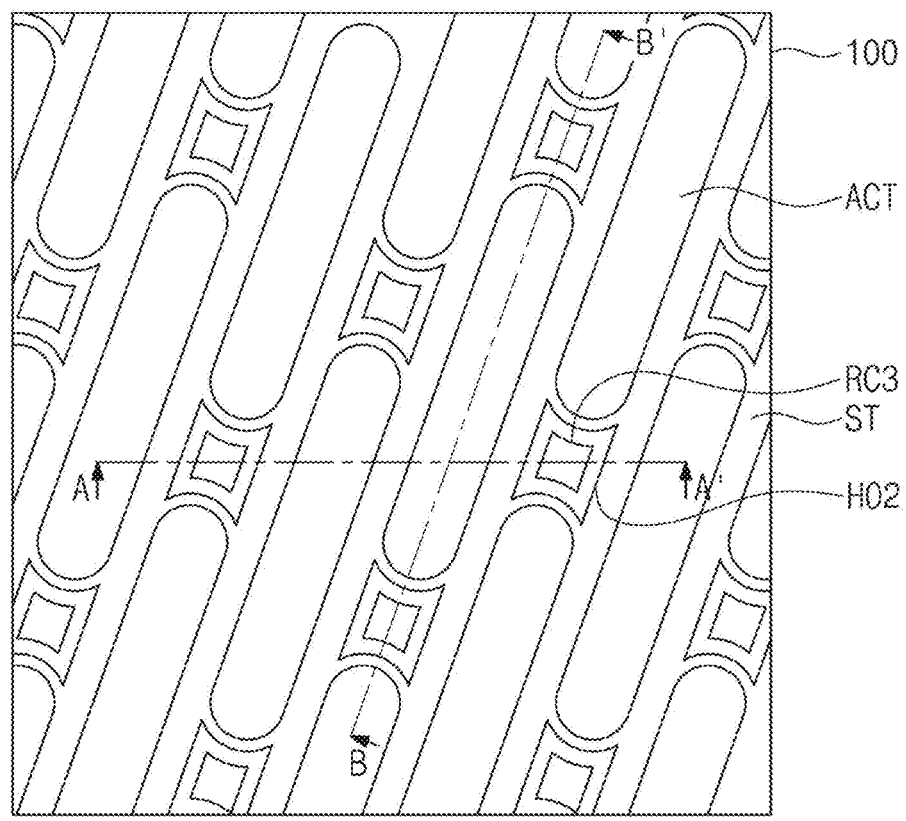
FIG. 2A is a plan view illustrating a method of fabricating a semiconductor device, according to an example embodiment of the inventive concepts.
Figure 2A:
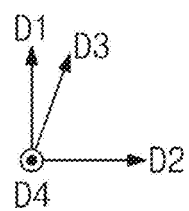
Figure 2B:
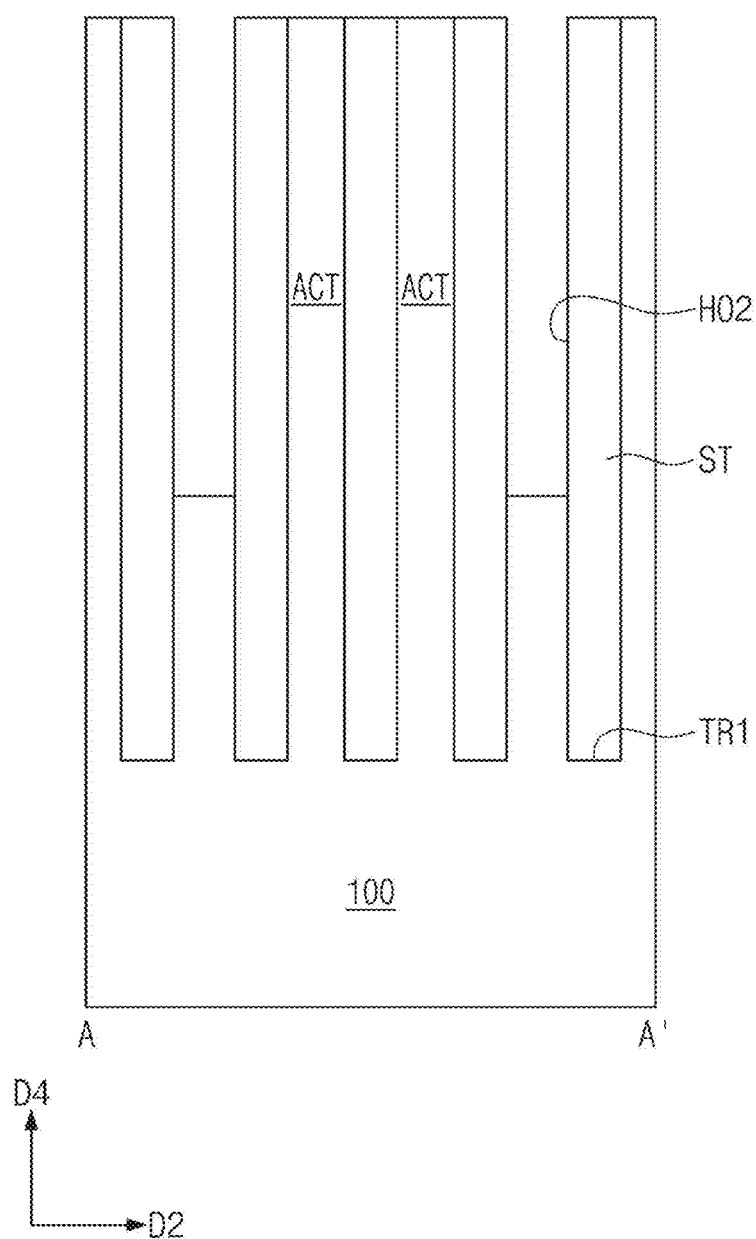
FIGS. 2B and 2C are sectional views taken along lines A-A' and B-B', respectively, of FIG. 2A.
Figure 2C:
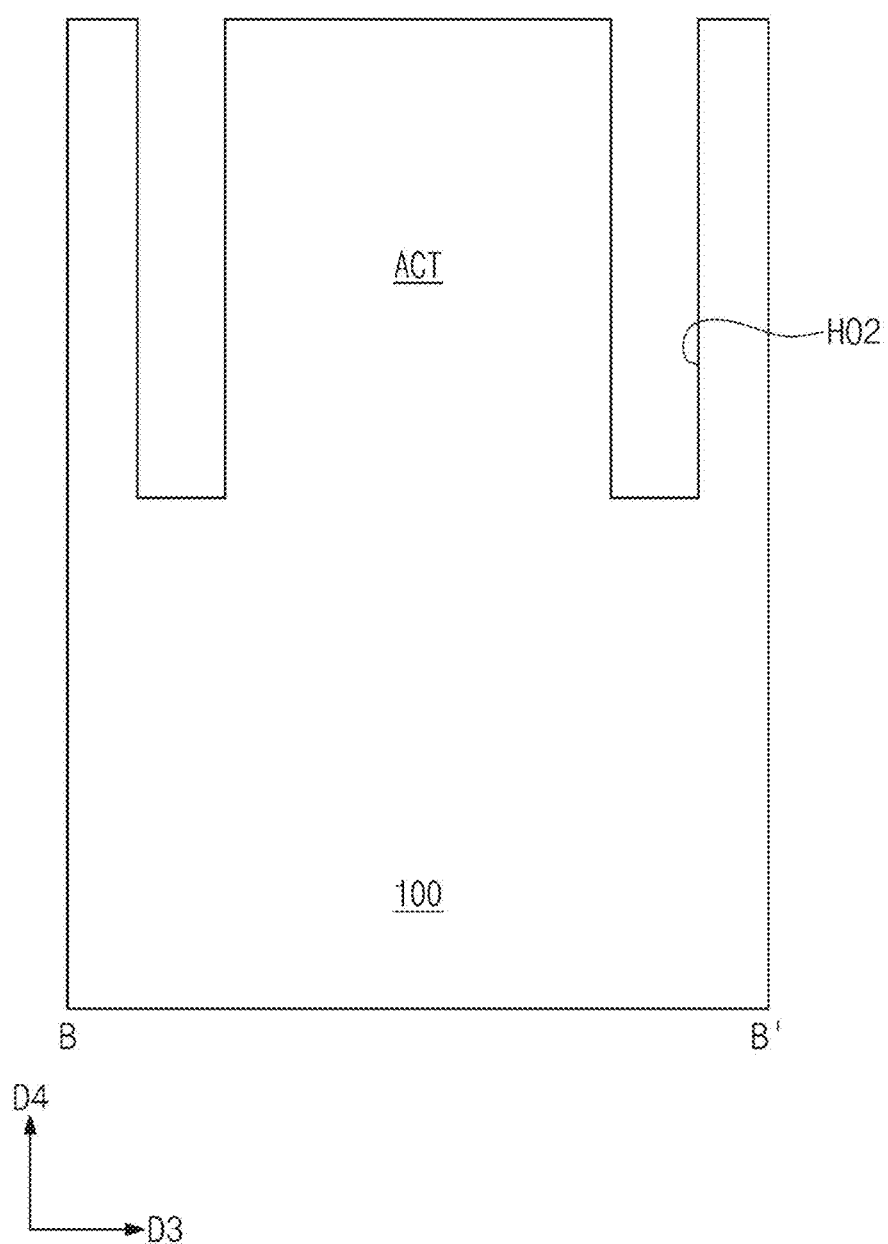
Figure 3A:
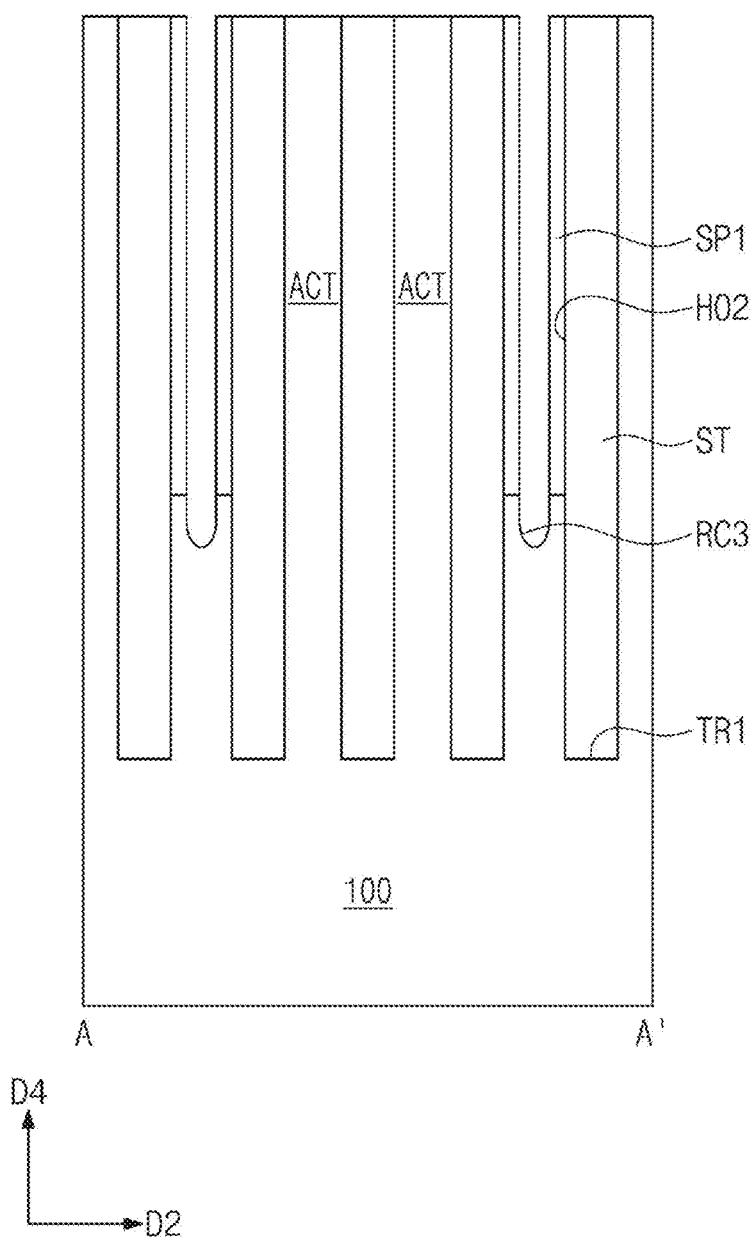
FIGS. 3A and 3B are sectional views taken along lines A-A' and B-B', respectively, of FIG. 2A.
Figure 3B:
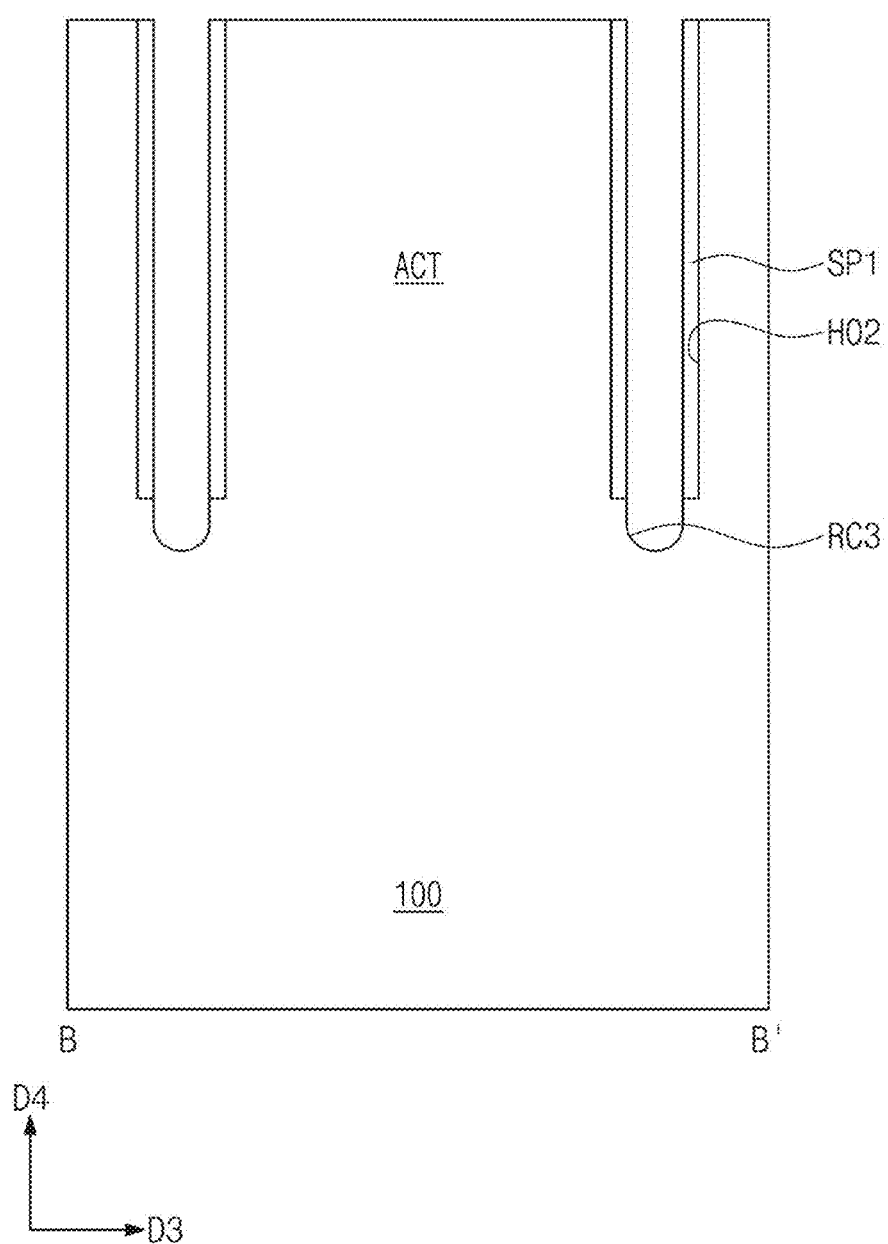

FIG. 2A is a plan view illustrating a method of fabricating a semiconductor device, according to an example embodiment of the inventive concepts. FIGS. 2B and 2C are sectional views taken along lines A-A' and B-B', respectively, of FIG. 2A. FIGS. 3A and 3B are sectional views taken along lines A-A' and B-B', respectively, of FIG. 2A. FIGS. 4A, 4B, 5A, 5B, 6A, 6B, 6A, 7A, 7B, 8A, 8B, 9A, 9B, 10A, 10B, 11A, and 11B are sectional views illustrating a method of fabricating a semiconductor device, according to an example embodiment of the inventive concepts.

Referring to FIGS. 2A, 2B, and 2C, the device isolation layer ST may be formed on the substrate 100. The formation of the device isolation layer ST may include etching the substrate 100 to form the first trenches TR1 and filling the first trenches TR1 with an insulating material.

Second holes HO2 may be formed, and as a result, the active patterns ACT may be formed. The formation of the second holes HO2 may include etching portions of the substrate 100, which is interposed between the device isolation layer ST.

Referring to the sectional view of FIG. 2C, each of the active pattern ACT may be provided between a pair of the second holes HO2. The active patterns ACT may be spaced apart from each other, in the third direction D3, with the second hole HO2 interposed therebetween.

Referring to FIGS. 2A, 3A, and 3B, first spacers SP1 and third recesses RC3 may be formed. The formation of the first spacers SP1 and the third recesses RC3 may include forming a first spacer layer to conformally cover the second holes HO2 and performing a first etching process. The first etching process may be performed to remove a portion of the first spacer layer on a bottom of the second hole HO2, and thus, the first spacer SP1 may be formed on a side surface of the second hole HO2. The first etching process may be performed to etch the substrate 100 exposed through the first spacer SP1, and in this case the third recesses RC3 may be formed.

The first spacer SP1 may be formed to conformally cover the side surface of the second hole HO2. The first spacer SP1 may be formed of or include silicon oxide.

The third recesses RC3 may be formed below the second holes HO2, respectively.

Figure 4A:
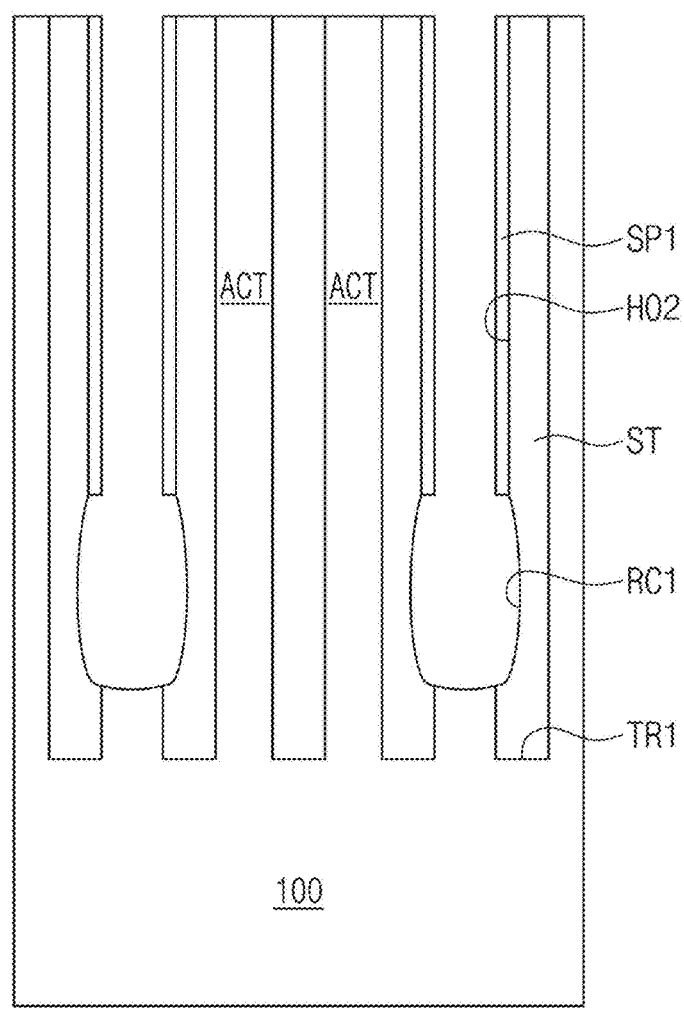
FIGS. 4A, 4B, 5A, 5B, 6A, 6B, 7A, 7B, 8A, 8B, 9A, 9B, 10A, 10B, 11A, and 11B are sectional views illustrating a method of fabricating a semiconductor device, according to an example embodiment of the inventive concepts.
Figure 4B:
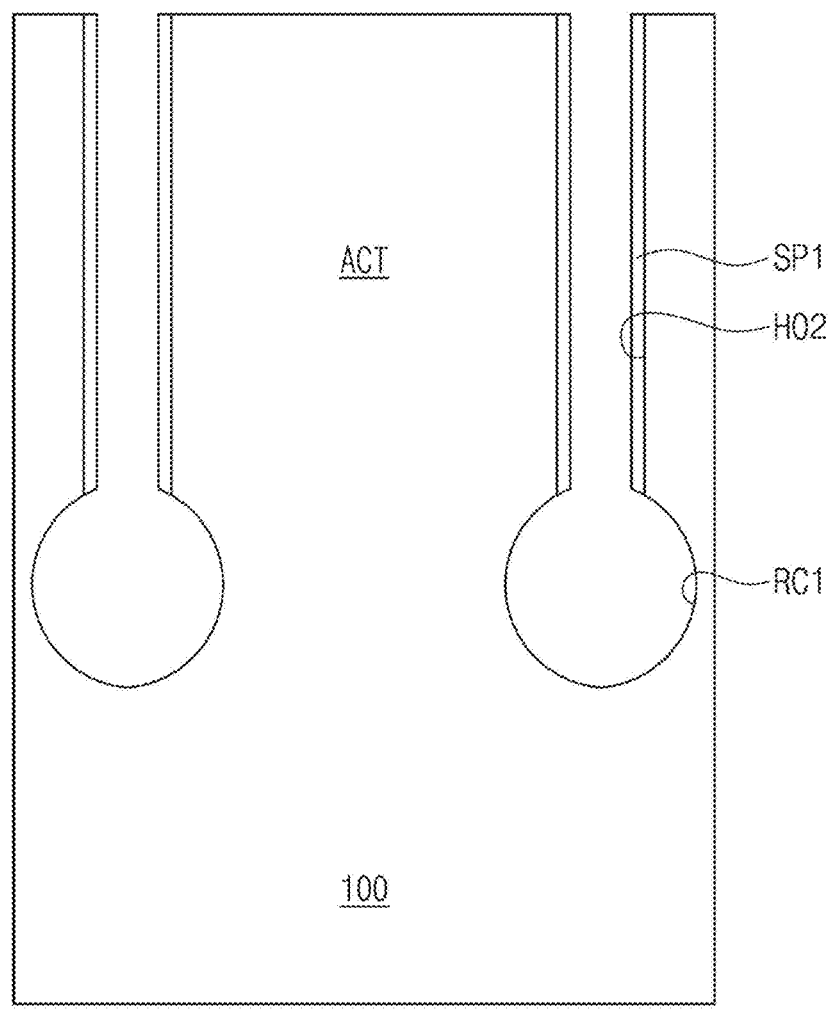

Referring to FIGS. 4A and 4B, a second etching process may be performed to increase a size of the third recesses RC3. For example, the second etching process may be performed to increase a width and a depth of the third recesses RC3. The substrate 100 and the device isolation layer ST, which are adjacent to the third recesses RC3, may be etched to expand the size of the third recesses RC3. The third recesses RC3 with the increased size may be defined as the first recesses RC1.

A largest width of the first recess RC1 in the third direction D3 may be greater than a largest width of the first recess RC1 in the second direction D2.

In the second etching process, an etch rate of the substrate 100 may be higher than an etch rate of the device isolation layer ST. The second etching process may be a wet etching process.

Figure 5A:
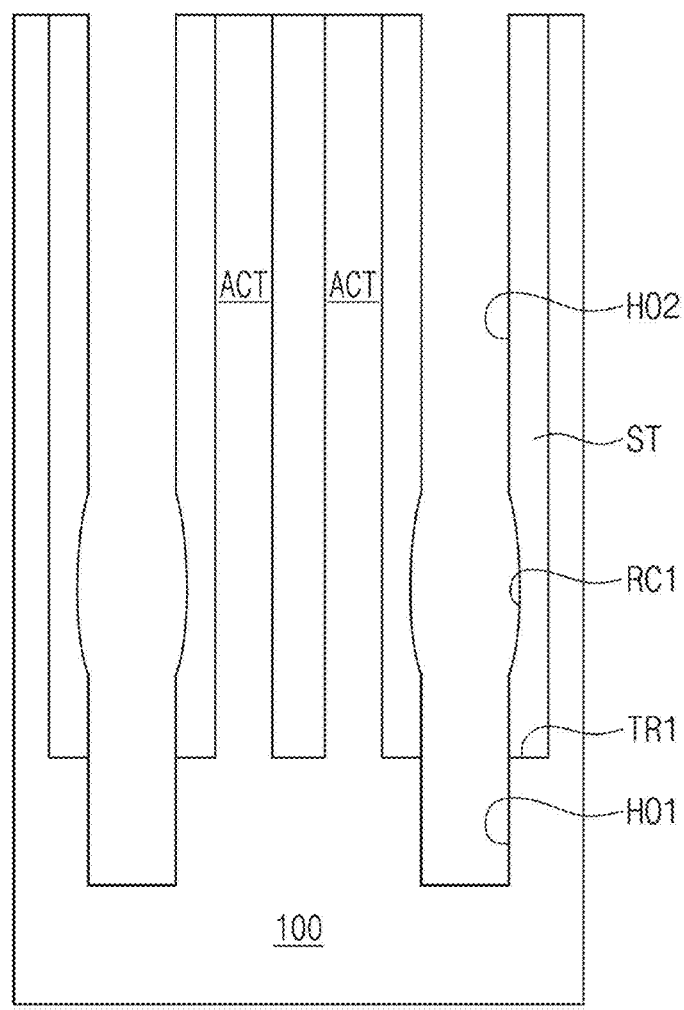
Figure 5B:
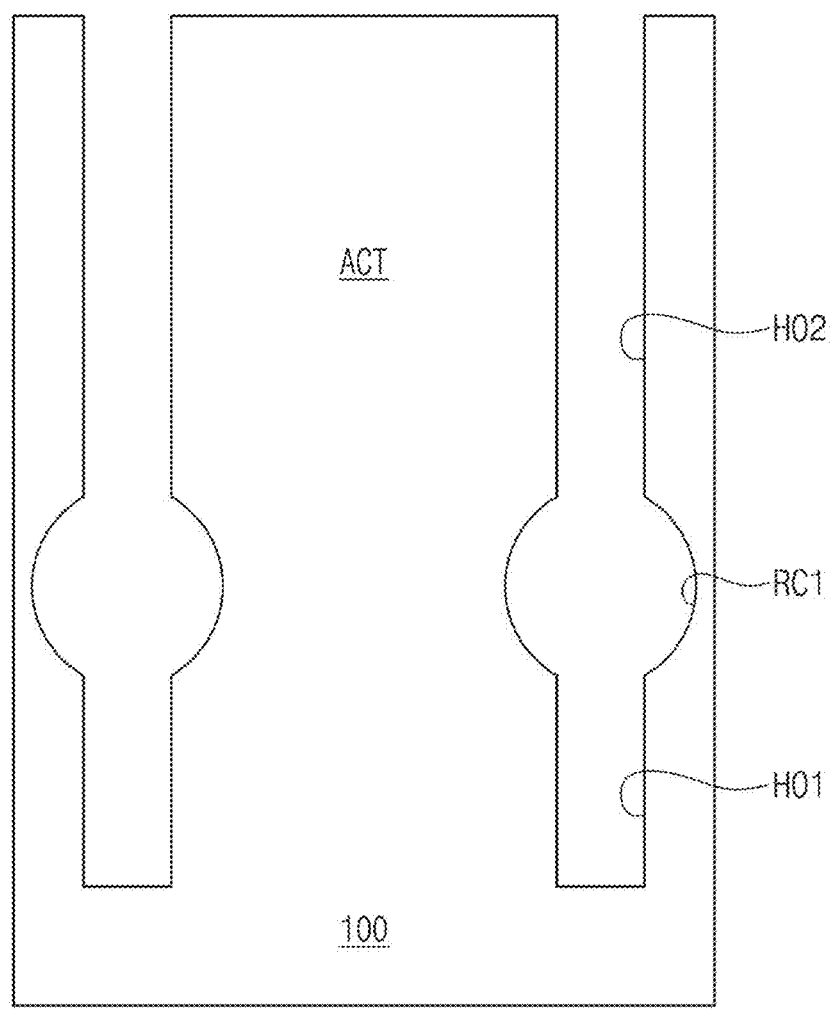

Referring to FIGS. 5A and 5B, a third etching process may be performed to form the first holes HO1. The third etching process may include etching the substrate 100 and the device isolation layer ST, which are located below the first recesses RC1, to form the first hole HO1 and removing the first spacer SP1 from the side surface of the second hole HO2. The first hole HO1 may be formed to penetrate a bottom of the first trench TR1.

The first holes HO1 may be formed below the first recesses RC1, respectively. A width of the first hole HO1 in the third direction D3 may be smaller than a largest width of the first recess RC1 in the third direction D3. A width of the first hole HO1 in the second direction D2 may be smaller than a largest width of the first recess RC1 in the second direction D2.

Figure 6A:
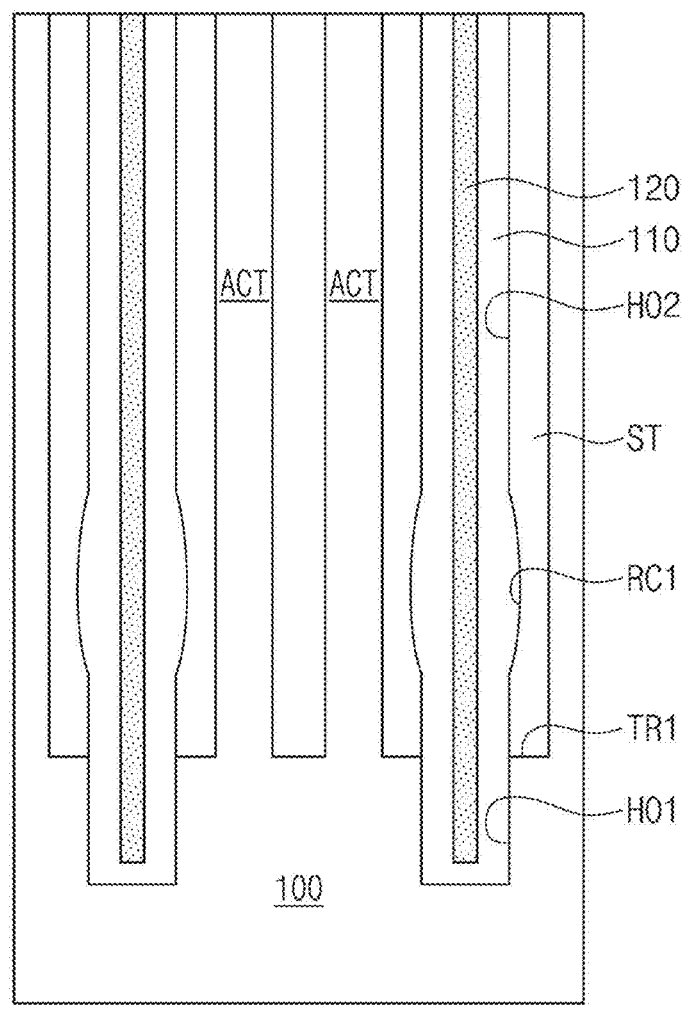
Figure 6B:
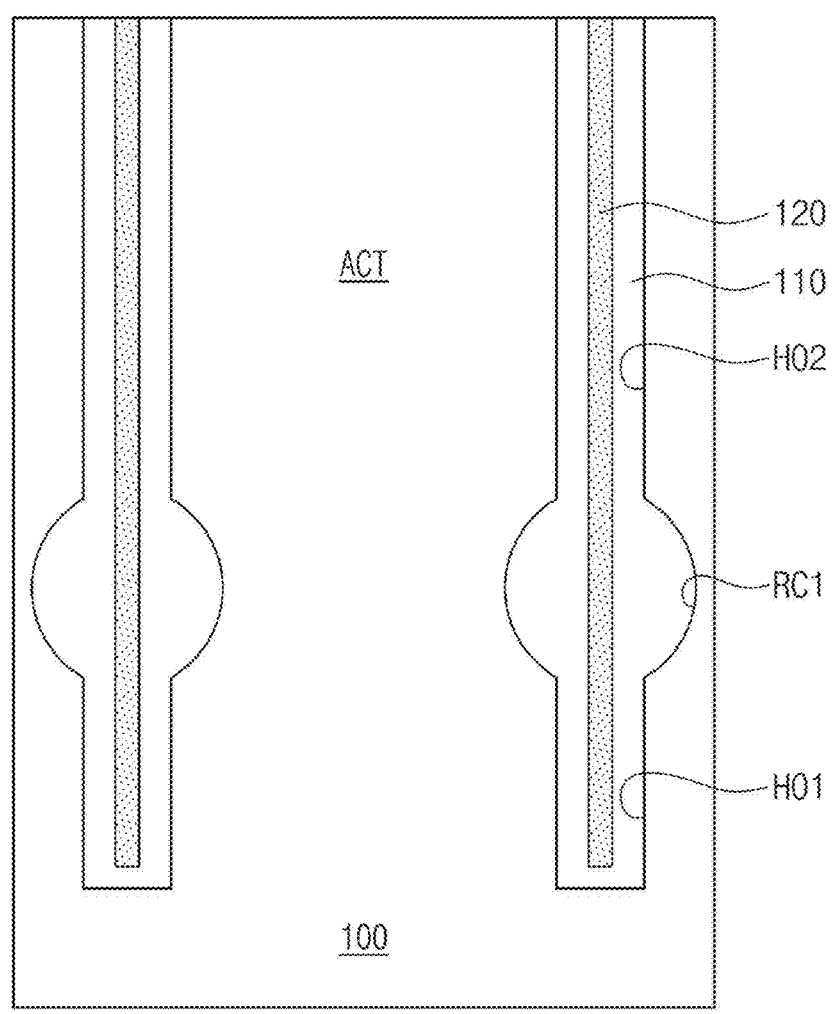

Referring to FIGS. 6A and 6B, a first insulating layer 110 and a second insulating layer 120 may be formed. The first insulating layer 110 and the second insulating layer 120 may be formed to fully fill the first and second holes HO1 and HO2 and the first recesses RC1.

The first insulating layer 110 may be formed to partially fill the first and second holes HO1 and HO2 and the first recesses RC1. In other words, the first insulating layer 110 may not completely fill the first and second holes HO1 and HO2 and the first recesses RC1.

The second insulating layer 120 may be formed on the first insulating layer 110. The second insulating layer 120 may be extended in the fourth direction D4. The second insulating layer 120 may pass through the second hole HO2 and the first recess RC1 and may be extended to the first hole HO1. As a result of the formation of the second insulating layer 120, the first and second holes HO1 and HO2 and the first recesses RC1 may be completely filled with the first insulating layer 110 and the second insulating layer 120.

The first insulating layer 110 and the second insulating layer 120 may be formed of or include different materials from each other. For example, the first insulating layer 110 may be formed of or include silicon oxide, and the second insulating layer 120 may be formed of or include silicon nitride.

Figure 7A:
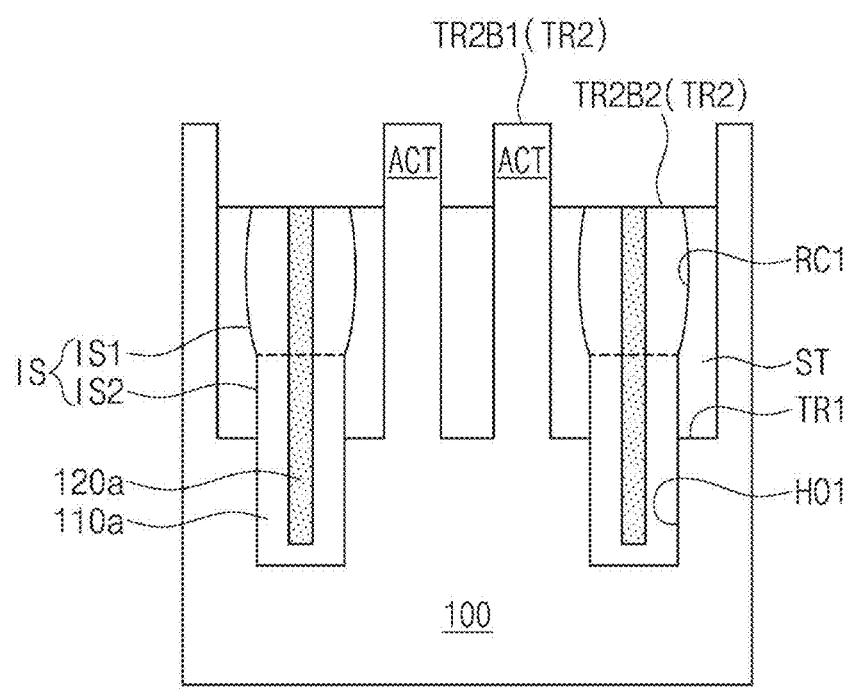
Figure 7B:
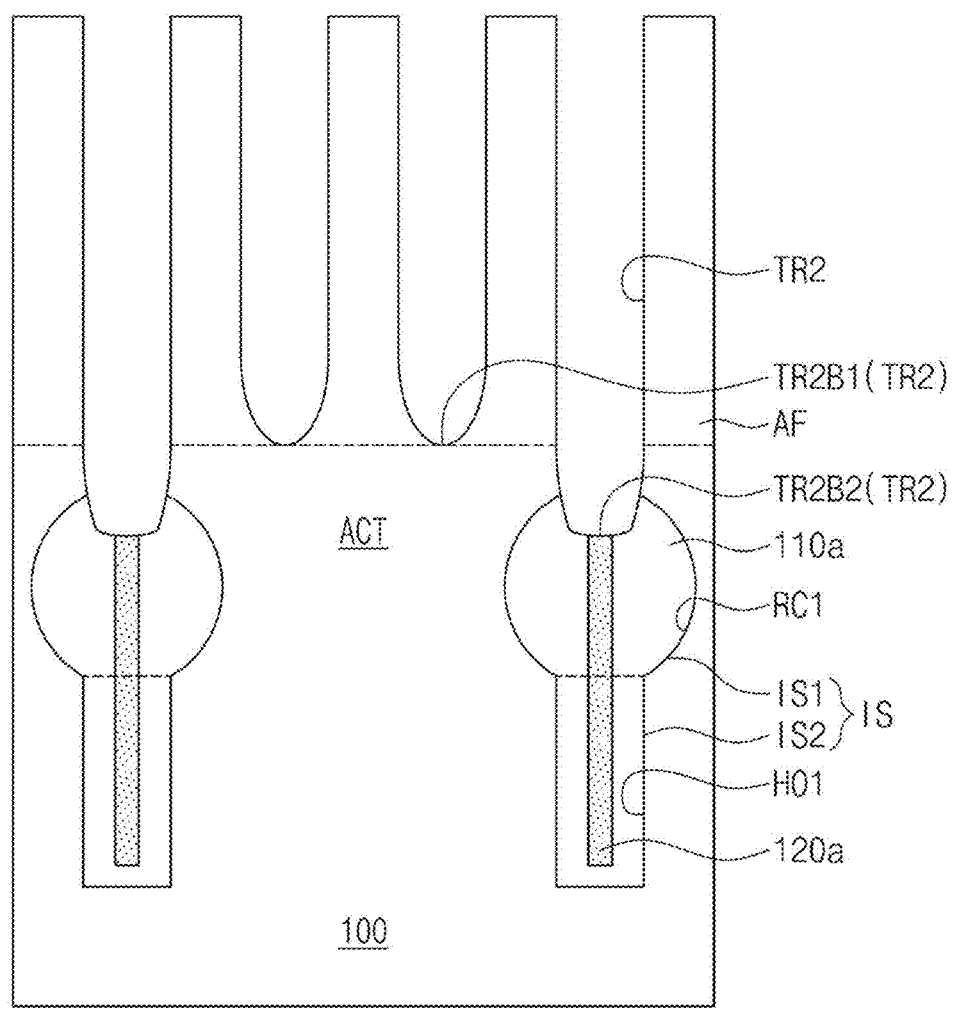

Referring to FIGS. 7A and 7B, the second trenches TR2 may be formed. The formation of the second trenches TR2 may include forming a mask pattern and etching portions of the active patterns ACT, the device isolation layer ST, the first insulating layer 110, and the second insulating layer 120, which are exposed when the mask pattern is used as an etch mask.

As a result of the formation of the second trench TR2, the first insulating layer 110 may be etched to form the first insulating pattern 110a, and the second insulating layer 120 may be etched to form the second insulating pattern 120a. In other words, as a result of the formation of the second trench TR2, the insulating structure IS including the first insulating pattern 110a and the second insulating pattern 120a may be formed.

As a result of the formation of the second trench TR2, the active fins AF may be formed in an upper portion of each of the active patterns ACT.

Each of the second trenches TR2 may include the first bottoms TR2B1 and the second bottoms TR2B2. The first bottom TR2B1 may be defined by the active pattern ACT. The second bottom TR2B2 may be defined by the insulating structure IS and the device isolation layer ST.

Figure 8A:
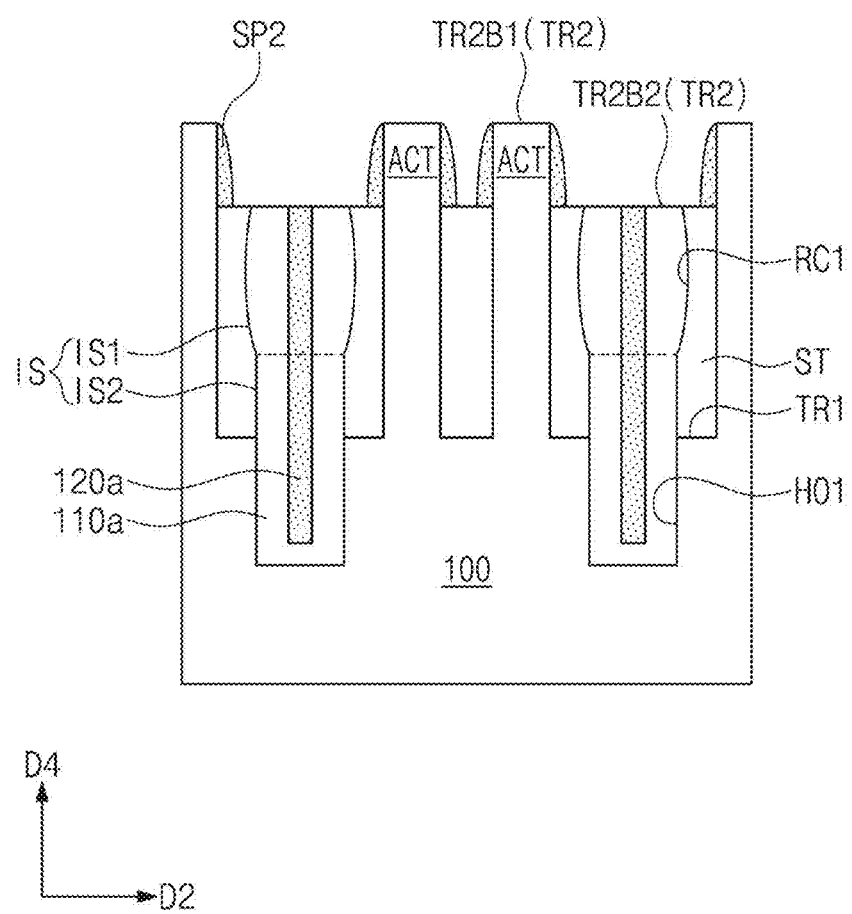
Figure 8B:
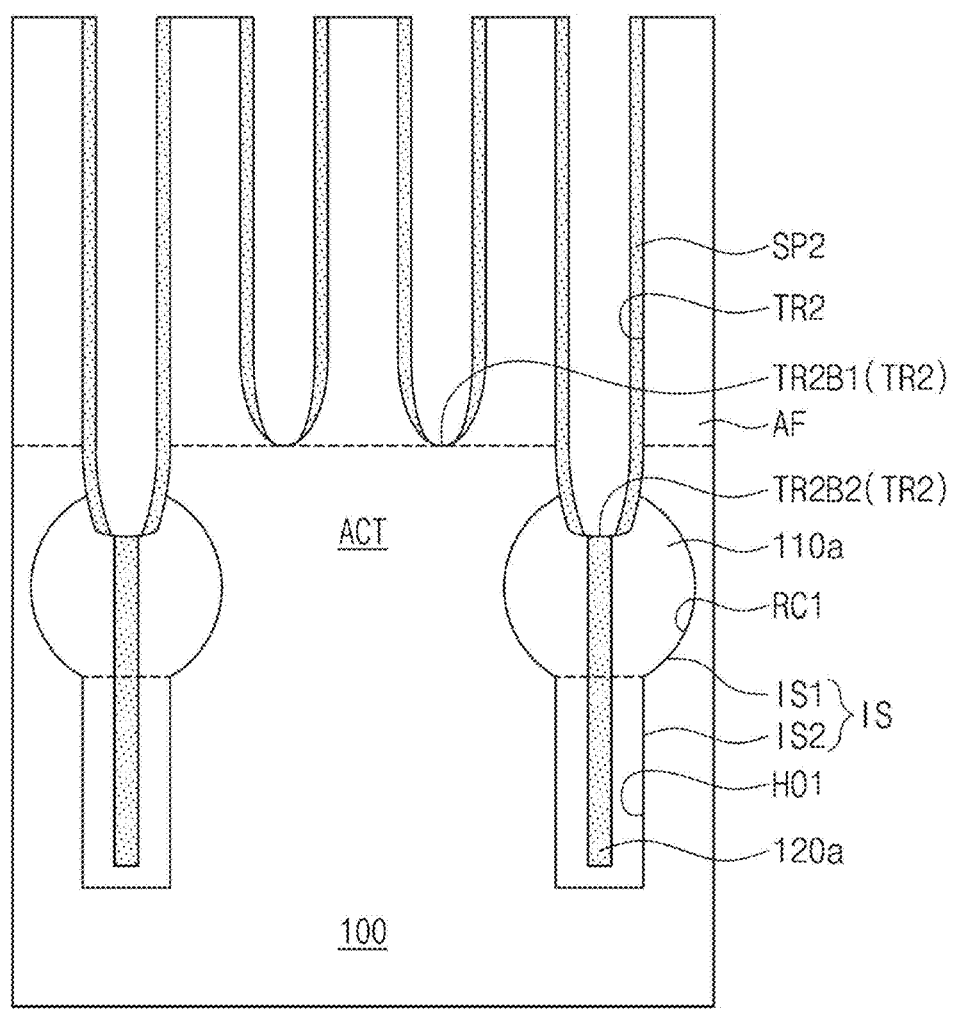

Referring to FIGS. 8A and 8B, second spacers SP2 may be formed. The formation of the second spacers SP2 may include forming a second spacer layer to conformally cover the second trenches TR2 and performing a fourth etching process. The fourth etching process may be performed to etch the second spacer layer on the first and second bottom surfaces TR2B1 and TR2B2 of the second trench TR2, and as a result, the second spacers SP2 may be formed. The fourth etching process may be an anisotropic etching process.

The second spacers SP2 may be formed on side surfaces of the active patterns ACT, which are exposed by the second trenches TR2. The second spacers SP2 may be formed of or include the same material as the second insulating pattern 120a. As an example, the second spacers SP2 may be formed of or include silicon nitride.

Figure 9A:
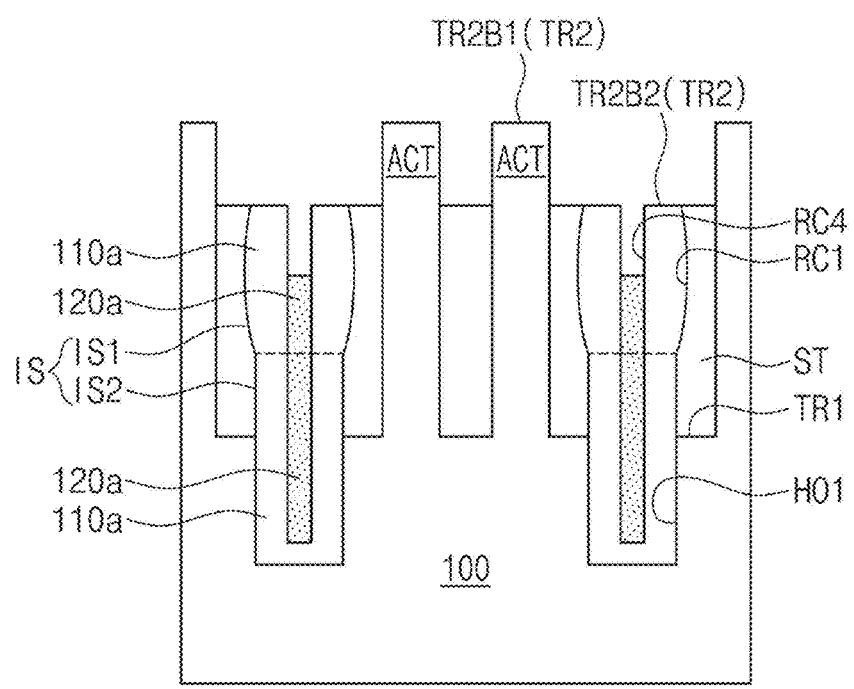
Figure 9A:
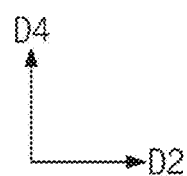
Figure 9B:
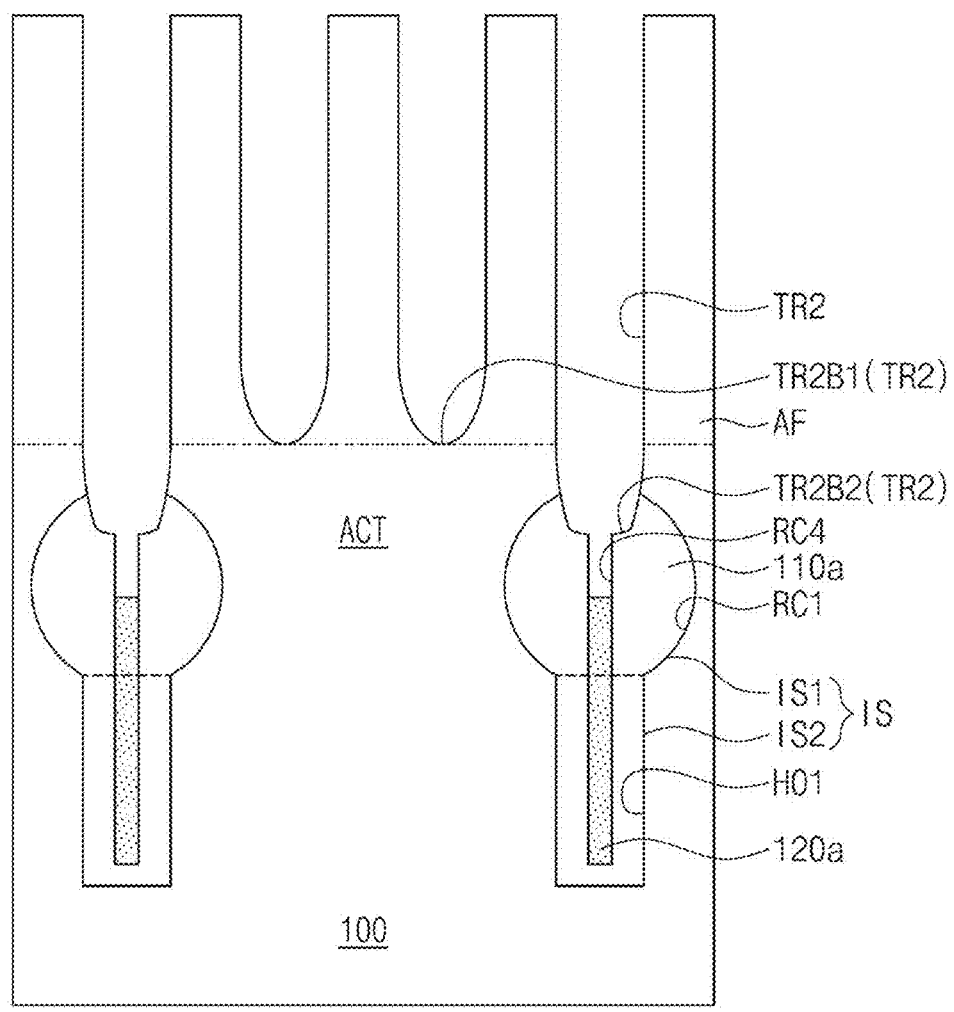

Referring to FIGS. 9A and 9B, a fifth etching process may be performed to remove the second spacers SP2 and form fourth recesses RC4. The fourth recess RC4 may be formed by etching the second insulating pattern 120a, which is exposed through the second trench TR2. In other words, the fourth recess RC4 may be formed by etching the second insulating pattern 120a defining the second bottom TR2B2 of the second trench TR2.

In an example embodiment, the fifth etching process may be performed to selectively remove the second spacers SP2 and the upper portion of the second insulating pattern 120a. The fifth etching process may be a wet etching process.

The fourth recess RC4 may be provided in the first recess RC1.

Figure 10A:
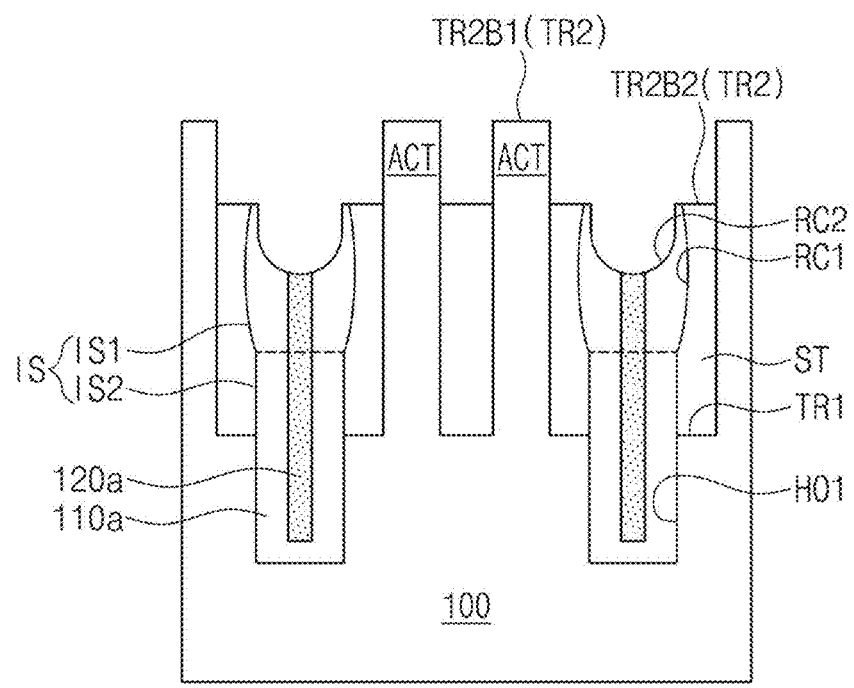
Figure 10B:
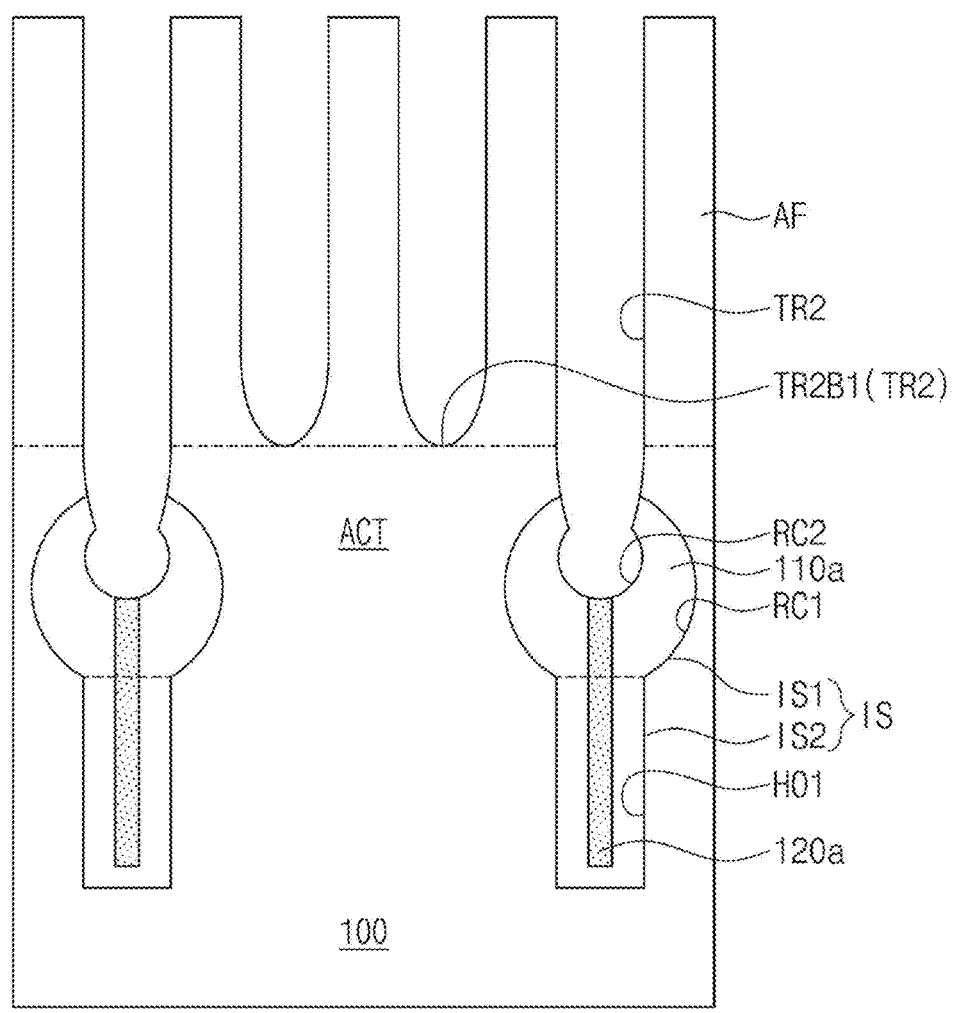

Referring to FIGS. 10A and 10B, a sixth etching process may be performed to increase the sizes of the fourth recesses RC4. In other words, widths of the fourth recesses RC4 may be increased. The first insulating pattern 110a adjacent to the fourth recess RC4 may be etched such that the fourth recess RC4 has an increased size. The fourth recess RC4 with the increased size may be defined as the second recess RC2.

The second recess RC2 may be provided in the first portion IS1 of the insulating structure IS. In other words, the second recess RC2 may be defined by the first portion IS1 of the insulating structure IS.

The sixth etching process may be a wet etching process.

Figure 11A:
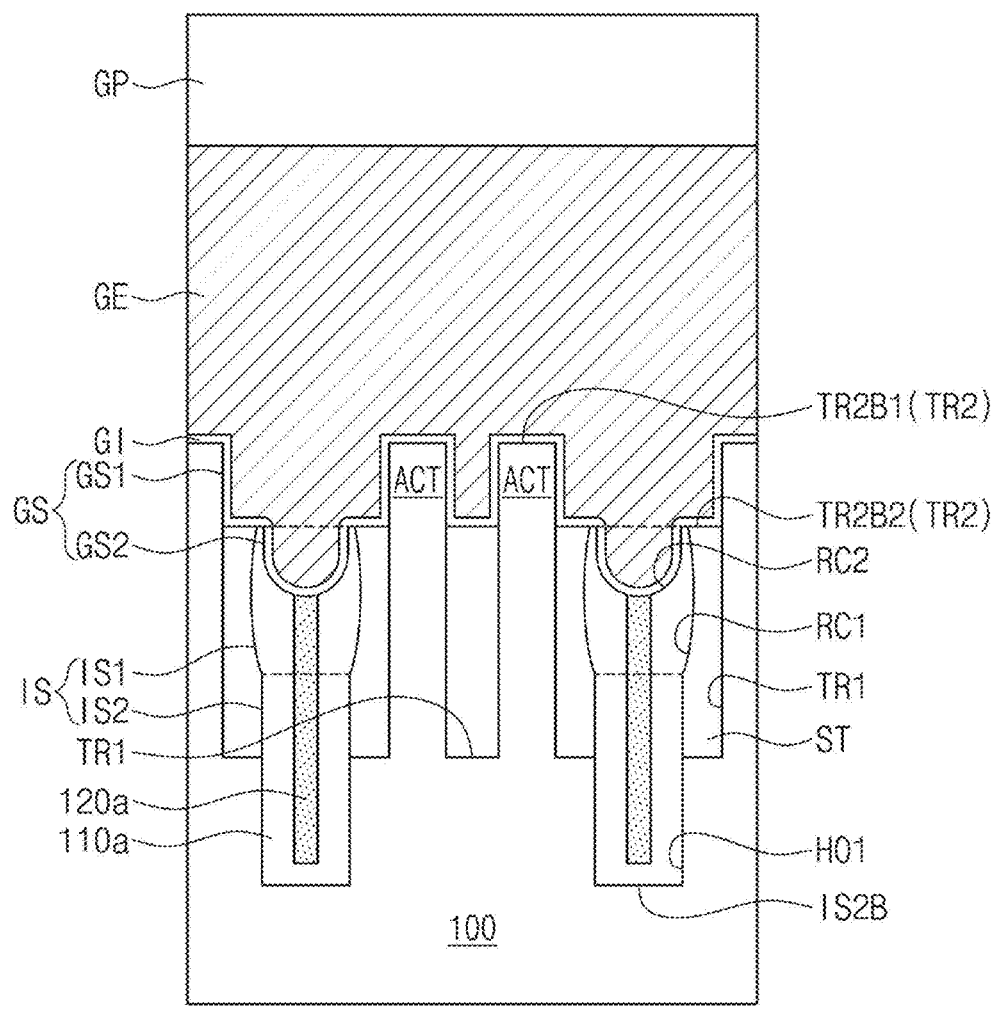
Figure 11B:
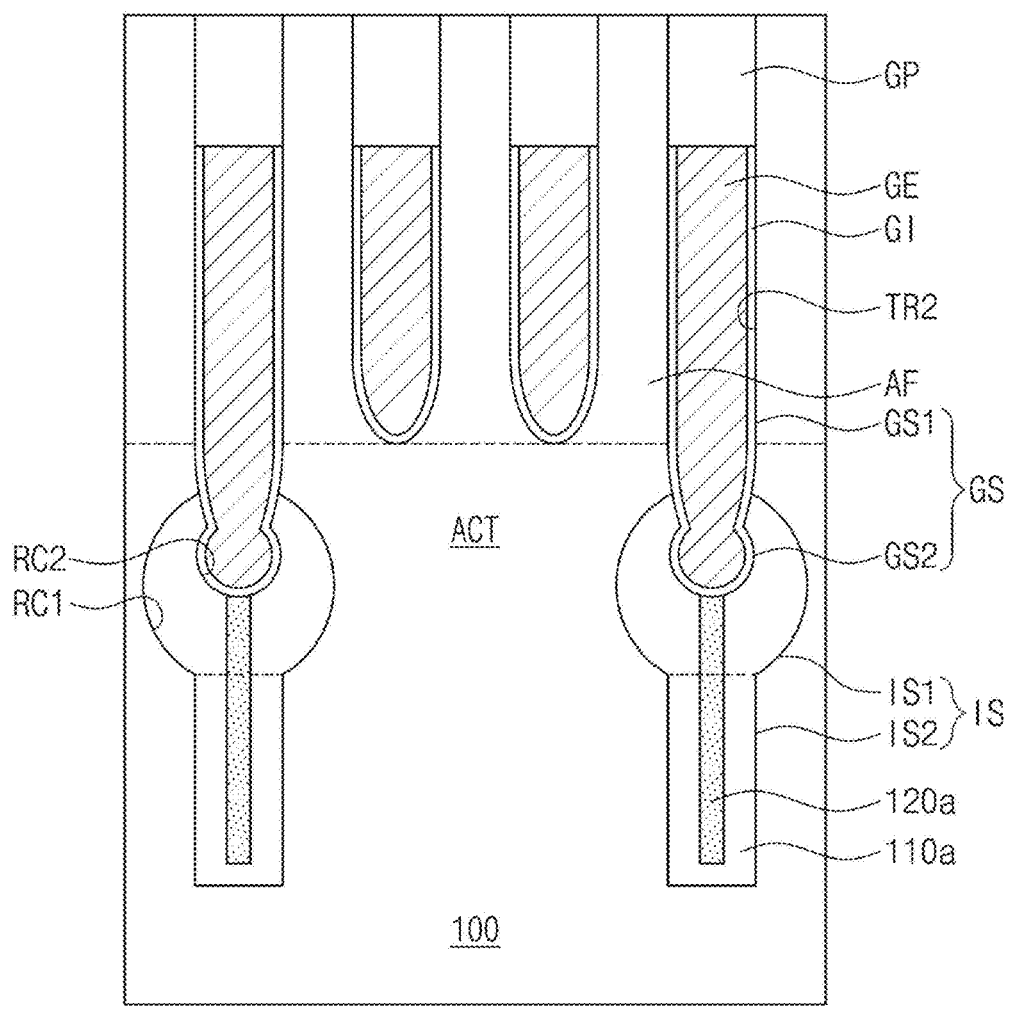

Referring to FIGS. 11A and 11B, the gate structures GS may be formed to fill the second recesses RC2 and the second trenches TR2. The formation of the gate structures GS may include forming the gate dielectric layer GI to conformally cover the second trenches TR2 and the second recesses RC2 and forming the gate electrode GE on the gate dielectric layer GI. The gate capping layer GP may be formed on the gate structure GS.

Referring back to FIGS. 1A, 1B, and 1C, an impurity injection process may be performed on an upper portion of the active patterns ACT to form the first and second impurity regions SD1 and SD2.

The mask pattern MP may be formed on the active patterns ACT and the gate capping layer GP, and then, upper portions of the gate capping layer GP and upper portions of the first impurity regions SD1 may be etched using the mask pattern MP as an etch mask.

The first contact CT1 may be formed on the first impurity regions SD1, the bit line BL may be formed on the first contact CT1, and the bit line capping layer BP may be formed on the bit line BL. The bit line BL and the bit line capping layer BP may be extended in the first direction D1.

The interlayered insulating pattern 130 may be formed on the mask pattern MP. The second contact CT2 may be formed to penetrate the interlayered insulating pattern 130 and to be connected to the second impurity region SD2. The data storing element DS may be formed on the second contact CT2.

Figure 12:
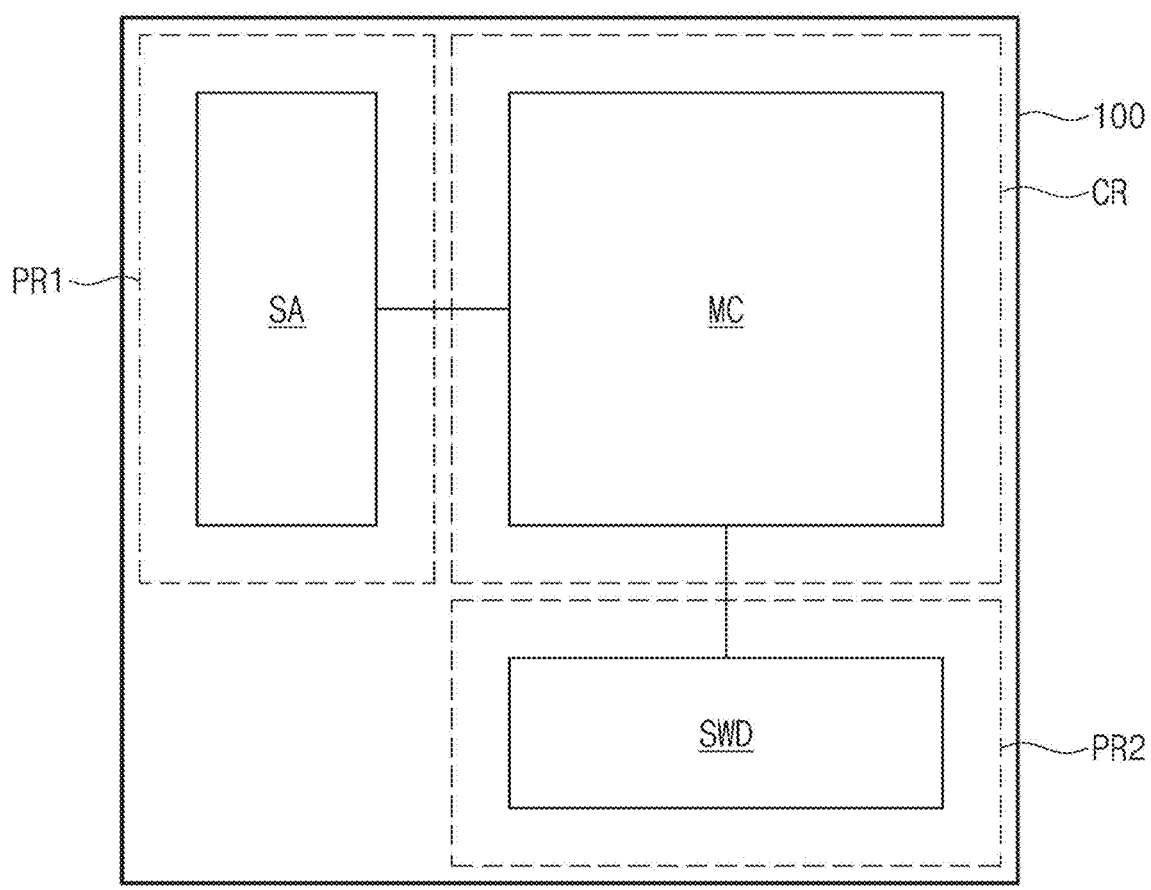
FIG. 12 is a schematic diagram illustrating a semiconductor device according to an example embodiment of the inventive concepts.

FIG. 12 is a schematic diagram illustrating a semiconductor device according to an example embodiment of the inventive concepts.

Referring to FIG. 12, a semiconductor device according to an example embodiment may include the substrate 100 including a cell region CR, a first peripheral region PR1, and a second peripheral region PR2.

A memory cell array MC may be provided in the cell region CR. A sense amplifier SA may be provided in the first peripheral region PR1. The sense amplifier SA may be connected to the memory cell array MC. The sense amplifier SA may amplify signals, which are generated in the memory cell array MC. A sub-word line driver SWD may be provided in the second peripheral region PR2. The sub-word line driver SWD may be connected to the memory cell array MC. The sub-word line driver SWD may control word lines of the memory cell array MC.

FIGS. 13A, 13B, 13C, 14A, 14B, 14C, 15A, 15B, 15C, 16A, 16B, and 16C are sectional views illustrating a method of fabricating the semiconductor device of FIG. 12.

FIGS. 13A, 14A, 15A, and 16A are sectional views illustrating a portion, where the cell region CR and the first peripheral region PR1 of FIG. 12 are connected to each other. FIGS. 13B, 14B, 15B, and 16B are sectional views illustrating a portion, in which the memory cell array MC of the cell region CR of FIG. 12 is provided. FIGS. 13C, 14C, 15C, and 16C are sectional views illustrating the second peripheral region PR2 of FIG. 12.

For concise description, a previously described element may be identified by the same reference number without repeating an overlapping description thereof.

Figure 13B:
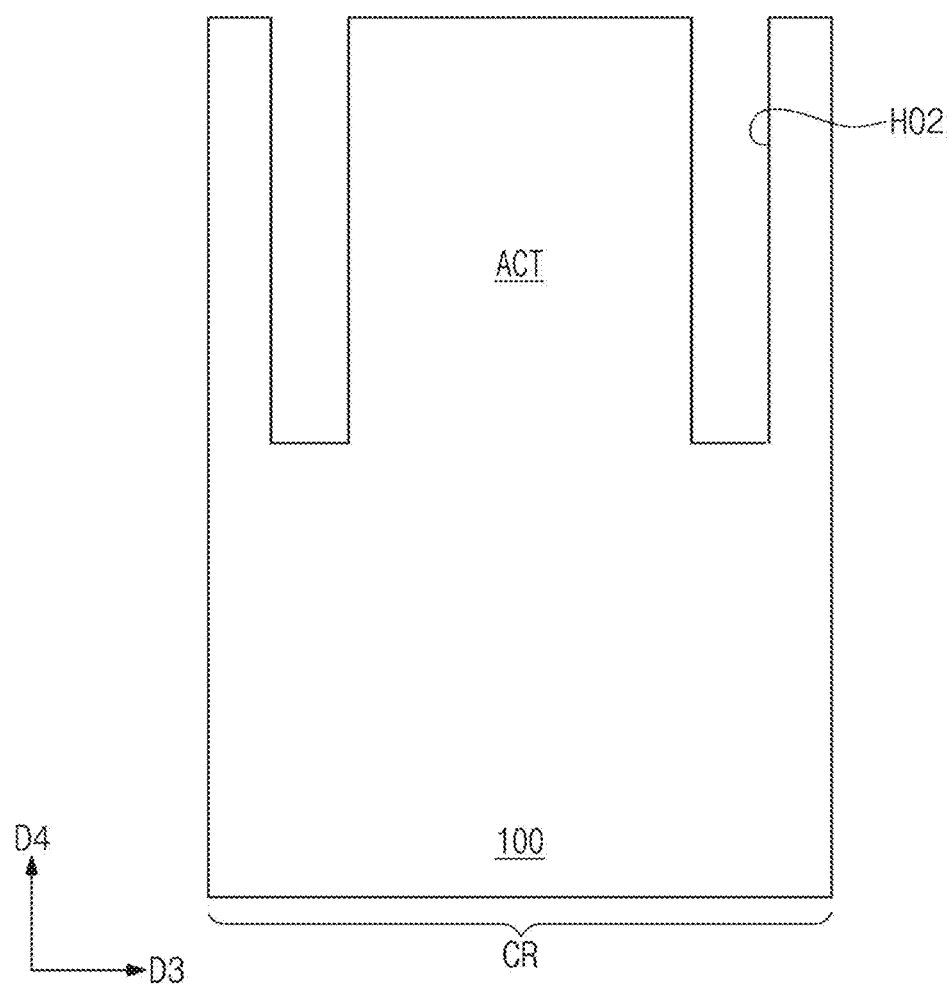
Figure 13C:
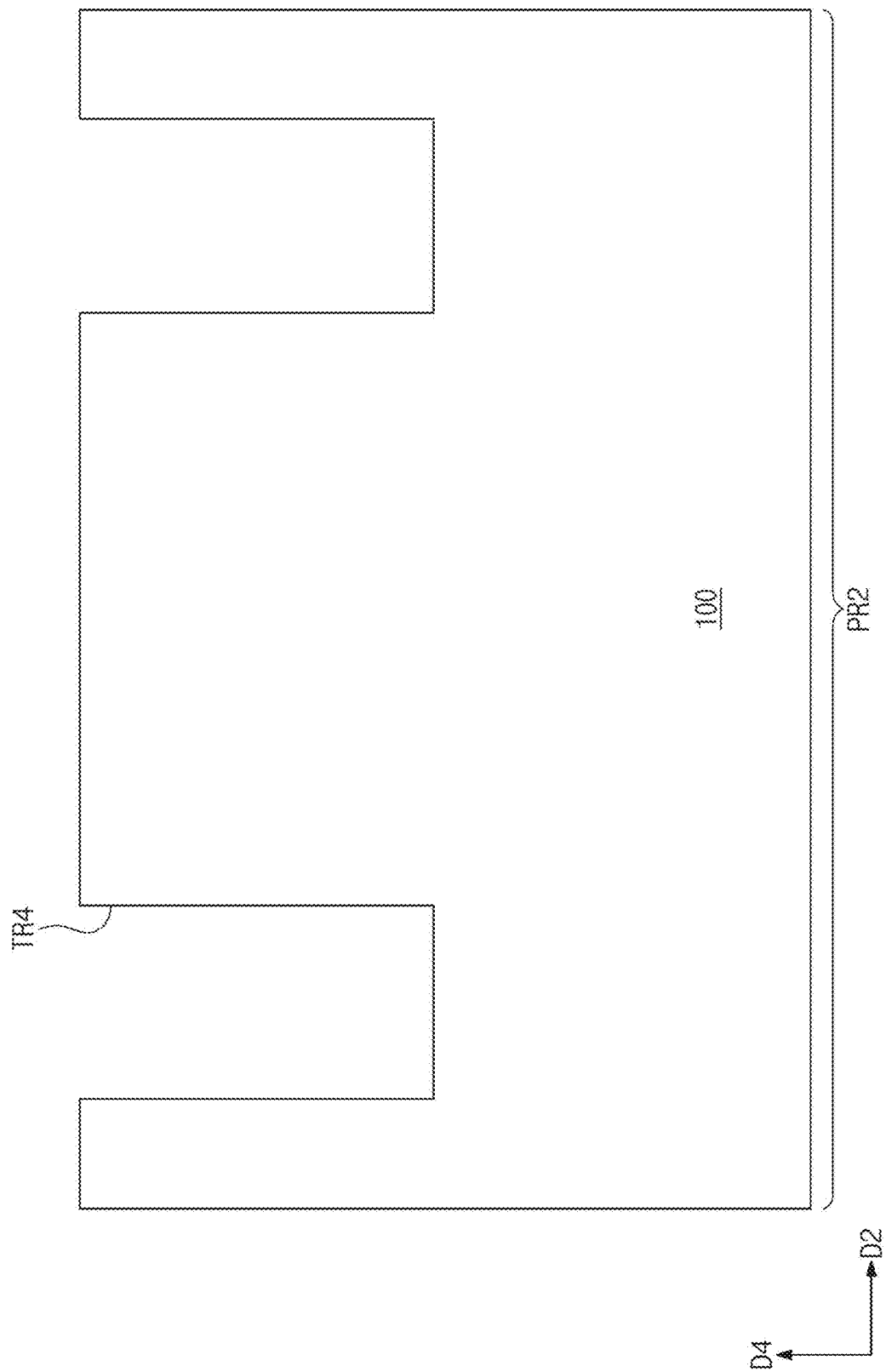

Referring to FIGS. 13A, 13B, and 13C, the device isolation layer ST may be formed in the cell region CR, and then, the second holes HO2 may be formed. As a result of the formation of the device isolation layer ST and the second holes HO2, the active patterns ACT may be formed in the cell region CR.

A third trench TR3 may be formed in a portion, where the first peripheral region PR1 and the cell region CR are connected to each other.

Fourth trenches TR4 may be formed in the second peripheral region PR2.

Figure 14B:
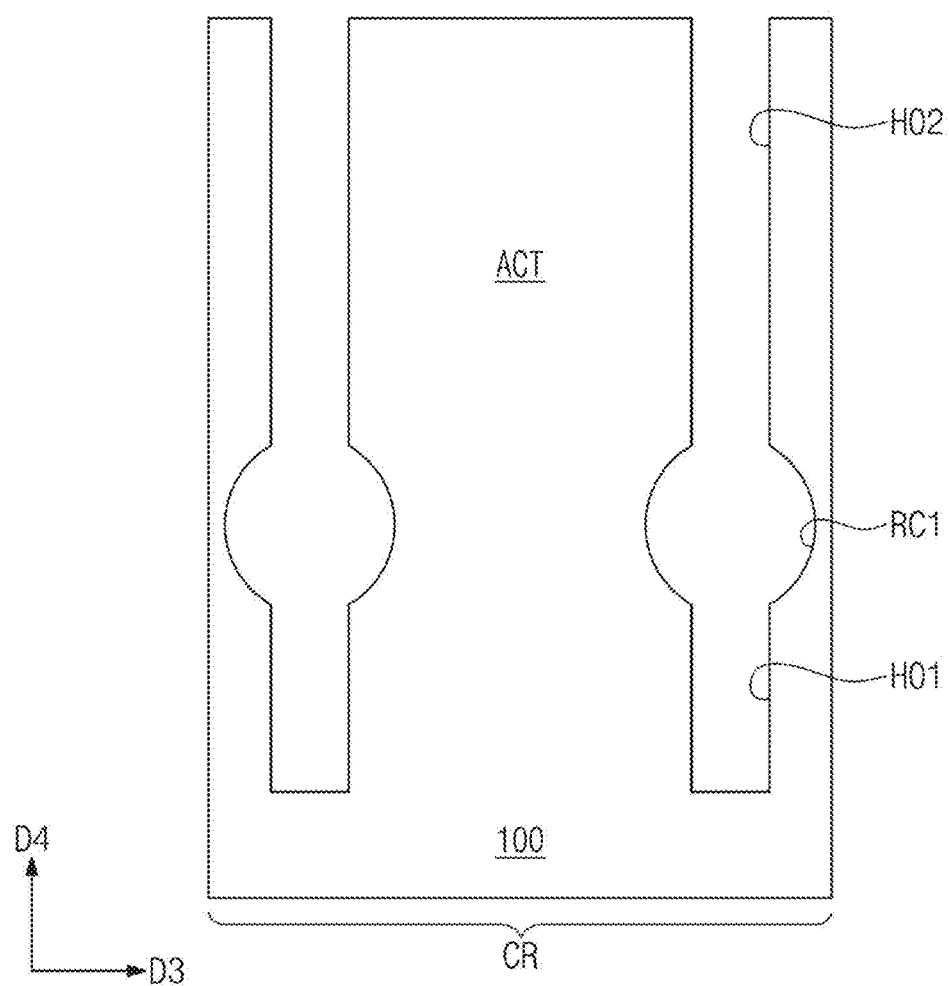

Referring to FIGS. 14A, 14B, and 14C, the first recess RC1 and the first hole HO1 may be formed below the second hole HO2.

Just as the first recess RC1 and the first hole HO1 are formed below the second hole HO2, a fifth recess RC5 and a fifth trench TR5 may be formed below the third trench TR3, and a sixth recess RC6 and a sixth trench TR6 may be formed below the fourth trench TR4.

Figure 15A:
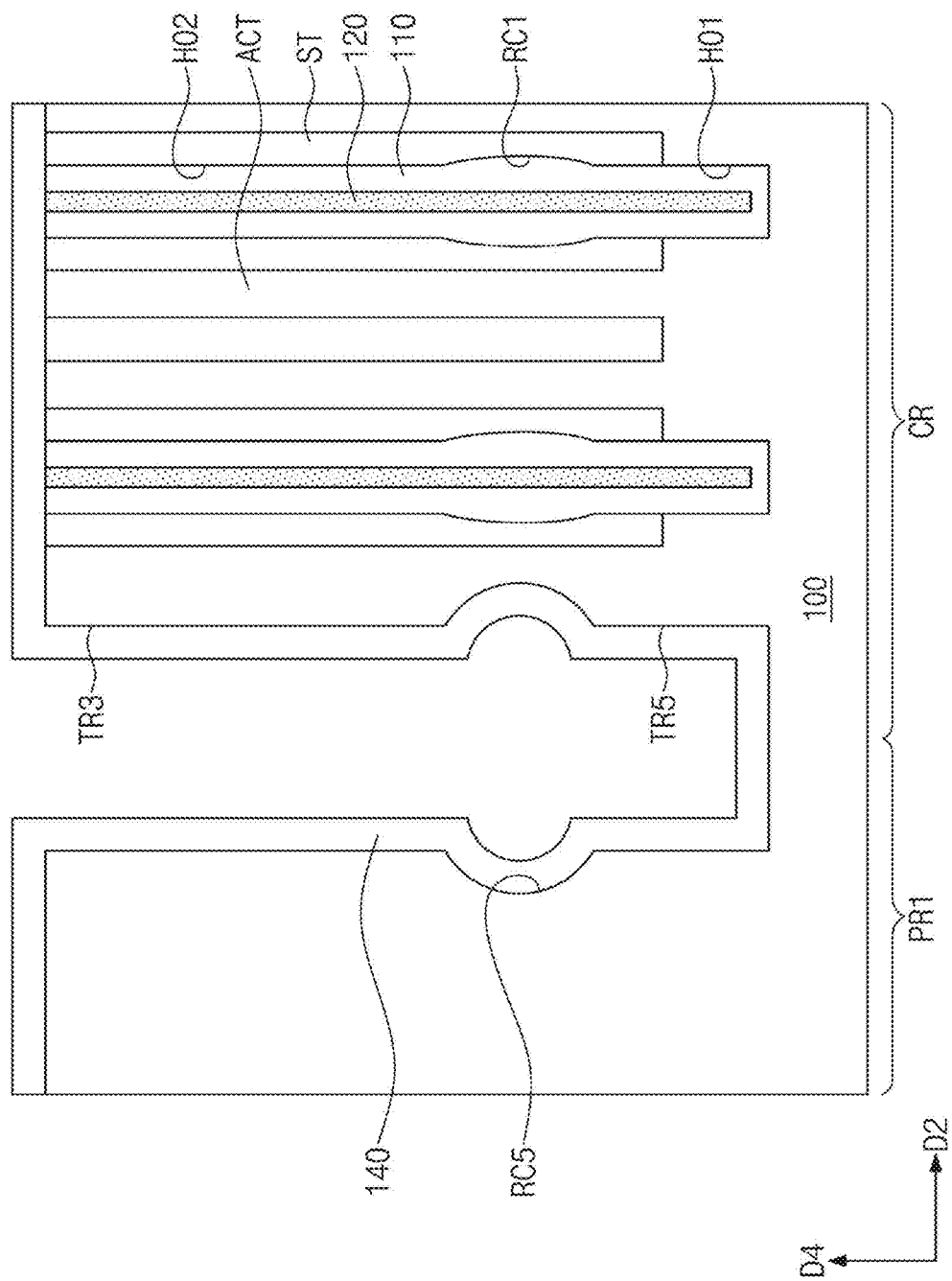
Figure 15B:
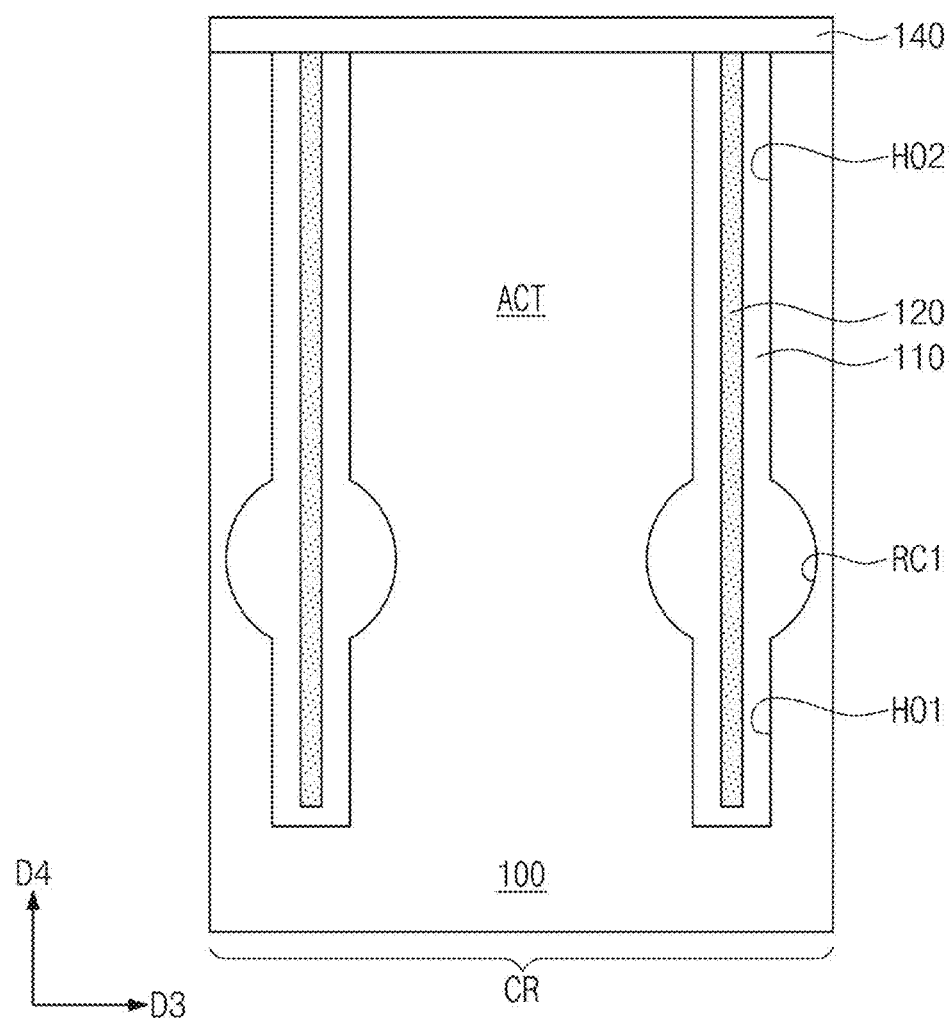
Figure 15C:
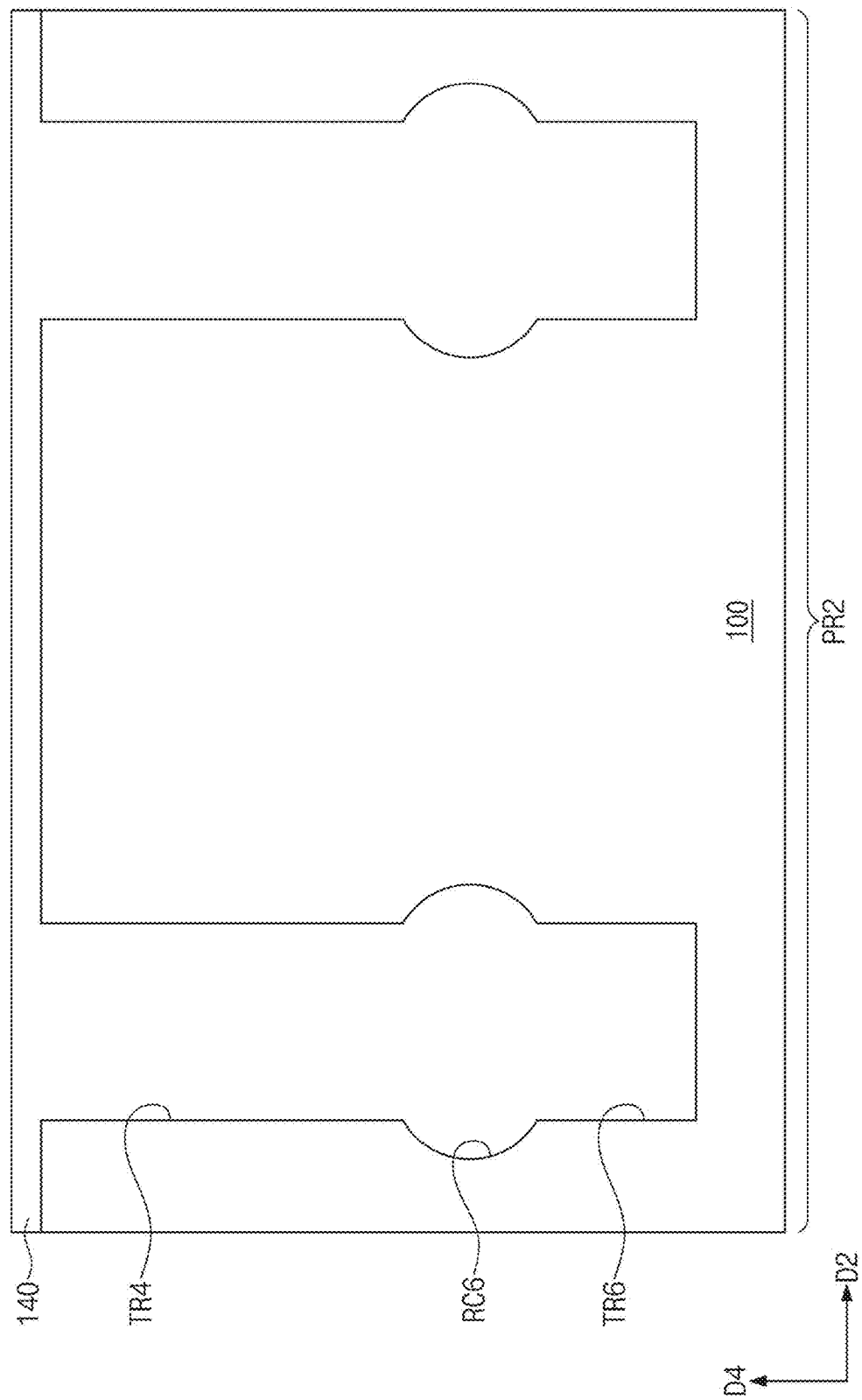

Referring to FIGS. 15A, 15B, and 15C, the first insulating layer 110 and the second insulating layer 120 may be formed to fill the second hole HO2, the first recess RC1, and the first hole HO1.

A third insulating layer 140 may be formed in the third trench TR3, the fifth recess RC5, and the fifth trench TR5. The third insulating layer 140 may be formed to partially fill the third trench TR3, the fifth recess RC5, and the fifth trench TR5.

The third insulating layer 140 may be formed in the fourth trench TR4, the sixth recess RC6, and the sixth trench TR6. The third insulating layer 140 may be formed to completely fill the fourth trench TR4, the sixth recess RC6, and the sixth trench TR6.

The third insulating layer 140 may be formed of or include silicon oxide.

Figure 16A:
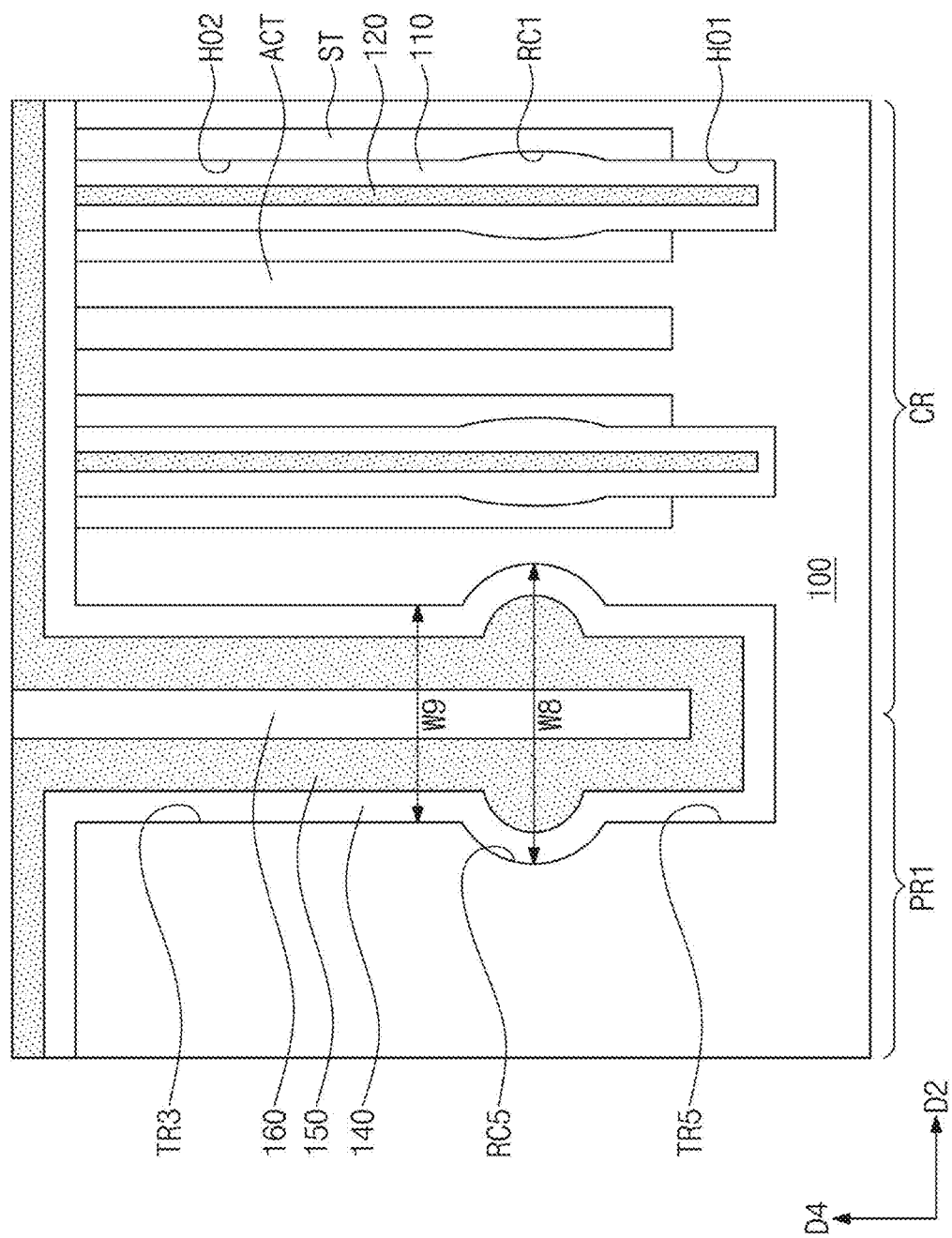
Figure 16B:
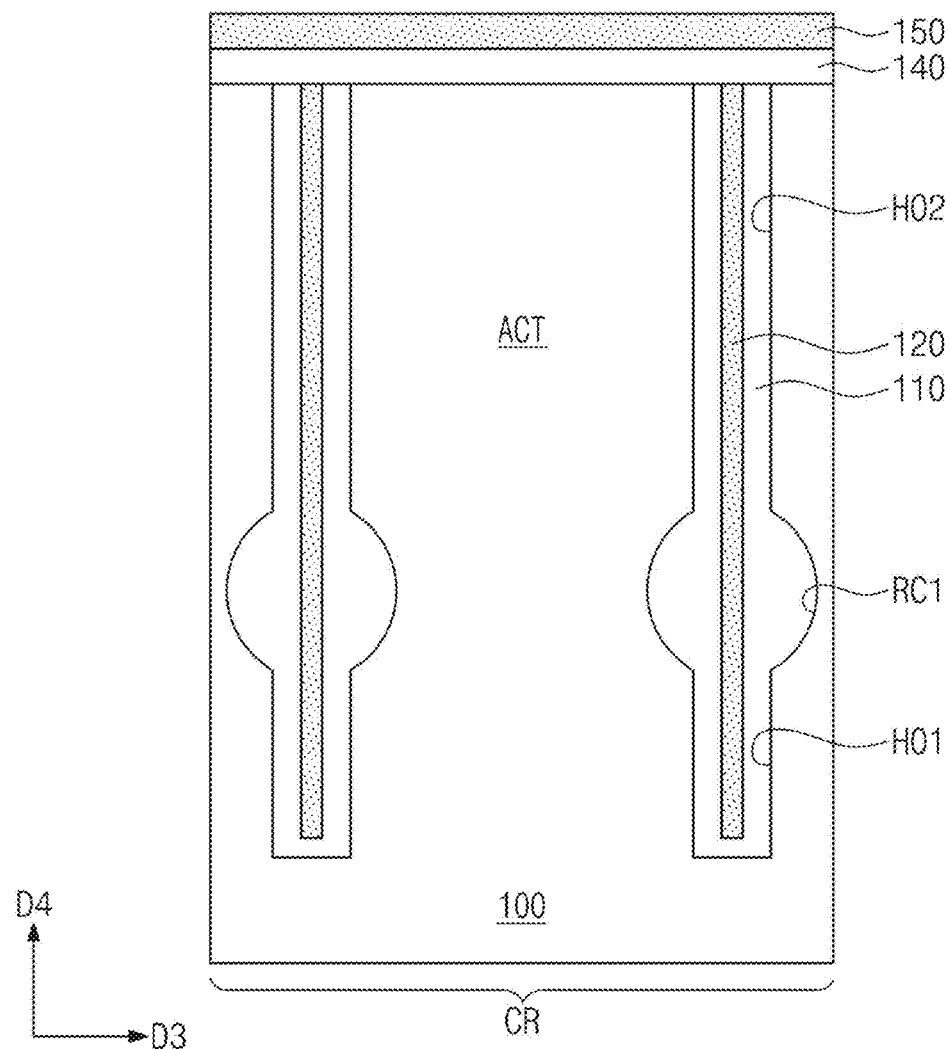
Figure 16C:
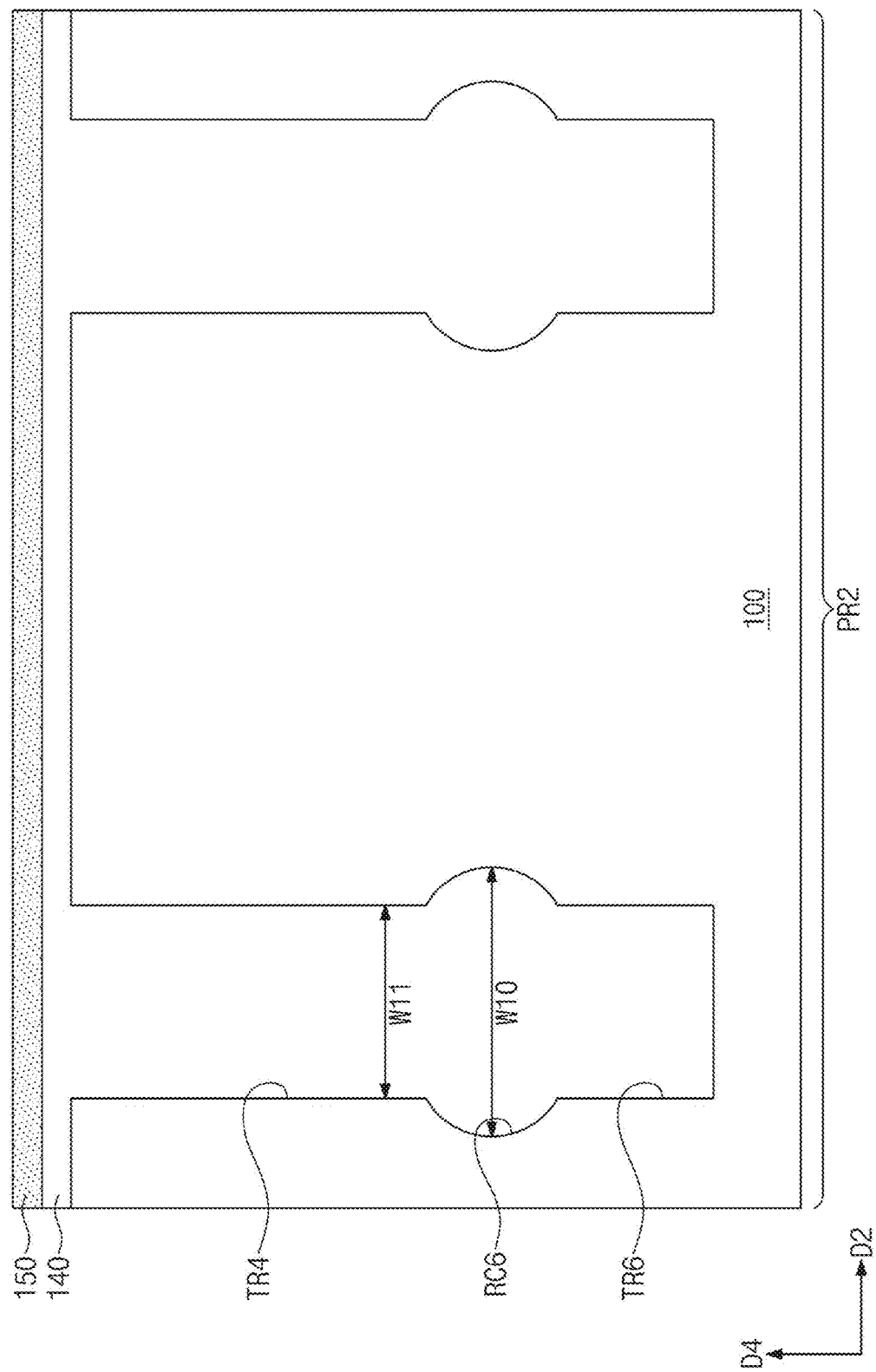

Referring to FIGS. 16A, 16B, and 16C, a fourth insulating layer 150 may be formed in the third trench TR3, the fifth recess RC5, and the fifth trench TR5. The fourth insulating layer 150 may be formed on the third insulating layer 140, which is formed in the third trench TR3, the fifth recess RC5, and the fifth trench TR5. The fourth insulating layer 150 may be formed to partially fill the third trench TR3, the fifth recess RC5, and the fifth trench TR5.

The fourth insulating layer 150 may be formed of or include silicon nitride.

A fifth insulating layer 160 may be formed in the third trench TR3, the fifth recess RC5, and the fifth trench TR5. The fifth insulating layer 160 may be formed on the fourth insulating layer 150, which is formed in the third trench TR3, the fifth recess RC5, and the fifth trench TR5. The third to fifth insulating layers 140, 150, and 160 may completely fill the third trench TR3, the fifth recess RC5, and the fifth trench TR5.

As described with reference to FIGS. 6A to 11B, transistors constituting the memory cell array MC may be formed on the cell region CR. Transistors constituting the sense amplifier SA may be formed on the first peripheral region PR1. Transistors constituting the sub-word line driver SWD may be formed on the second peripheral region PR2.

In the method according to an example embodiment, since the third trench TR3 and the second hole HO2 are formed at the same time, the fifth recess RC5 may be formed. A largest width W8, in the second direction D2, of the third to fifth insulating layers 140, 150, and 160 filling the fifth recess RC5 may be greater than a largest width W9, in the second direction D2, of the third to fifth insulating layers 140, 150, and 160 filling the third and fifth trenches TR3 and TR5.

In the method according to an example embodiment, since the fourth trench TR4 and the second hole HO2 are formed at the same time, the sixth recess RC6 may be formed. A largest width W10, in the second direction D2, of the third insulating layer 140 filling the sixth recess RC6 may be greater than a largest width W11, in the second direction D2, of the third insulating layer 140 filling the fourth and sixth trenches TR4 and TR6.

FIGS. 17A, 17B, 17C, 18A, 18B, and 18C are sectional views illustrating a method of fabricating the semiconductor device of FIG. 12.

Figure 17A:
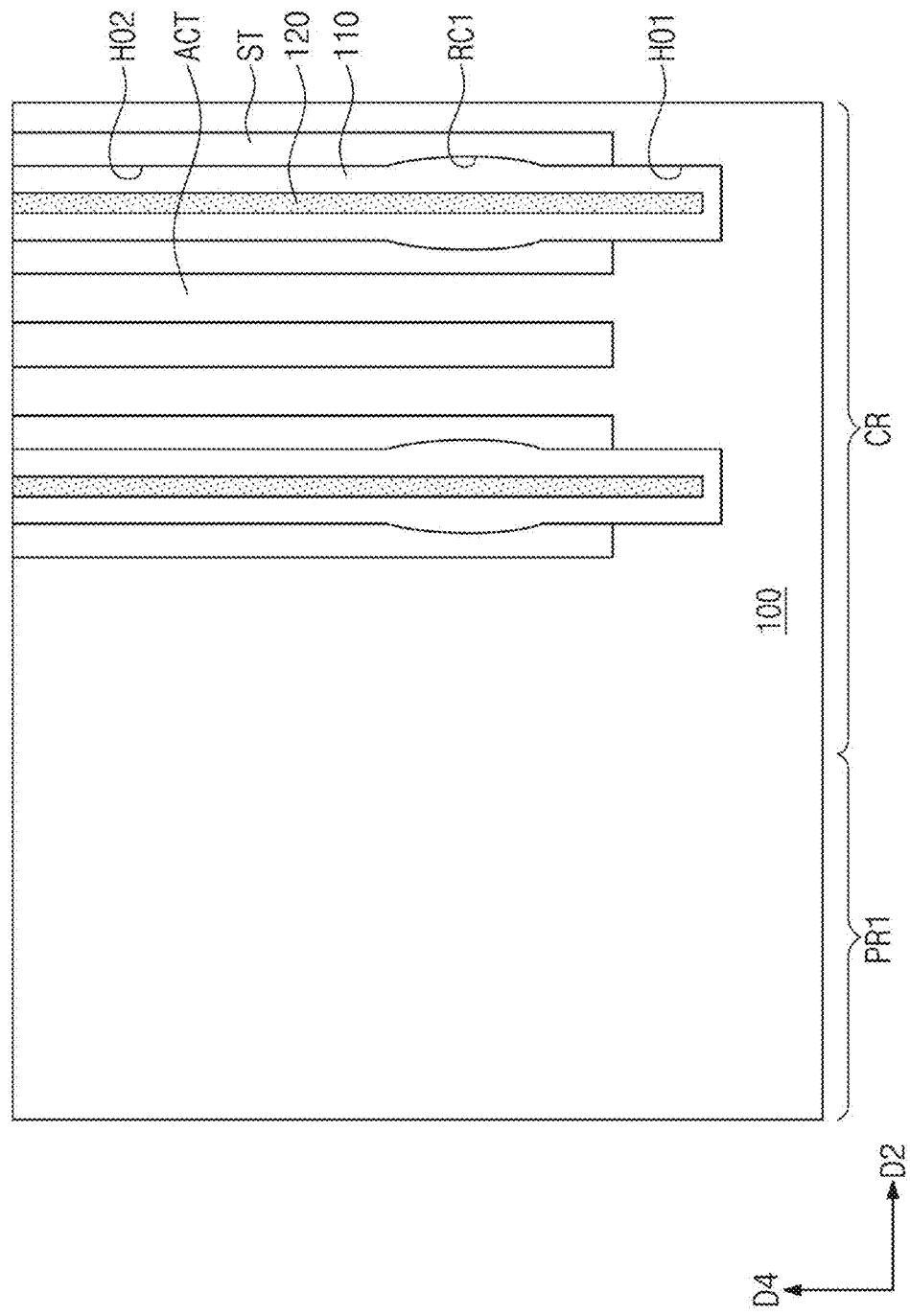
Figure 17B:
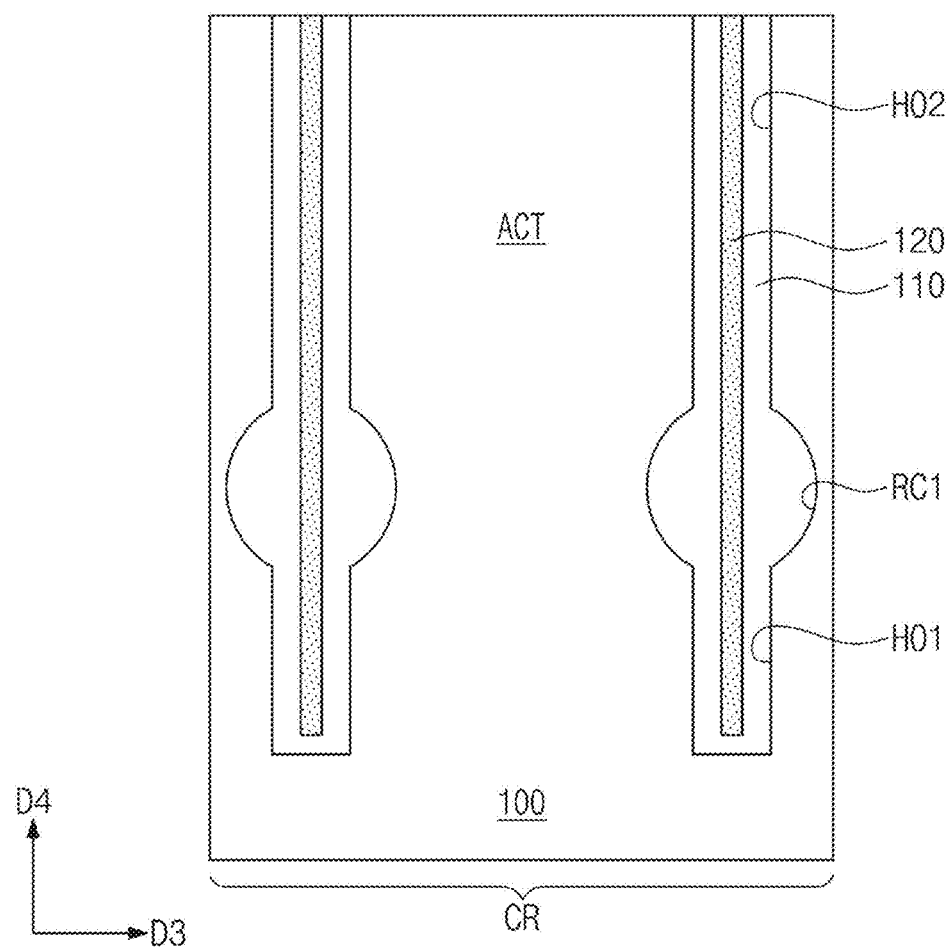
Figure 17C:
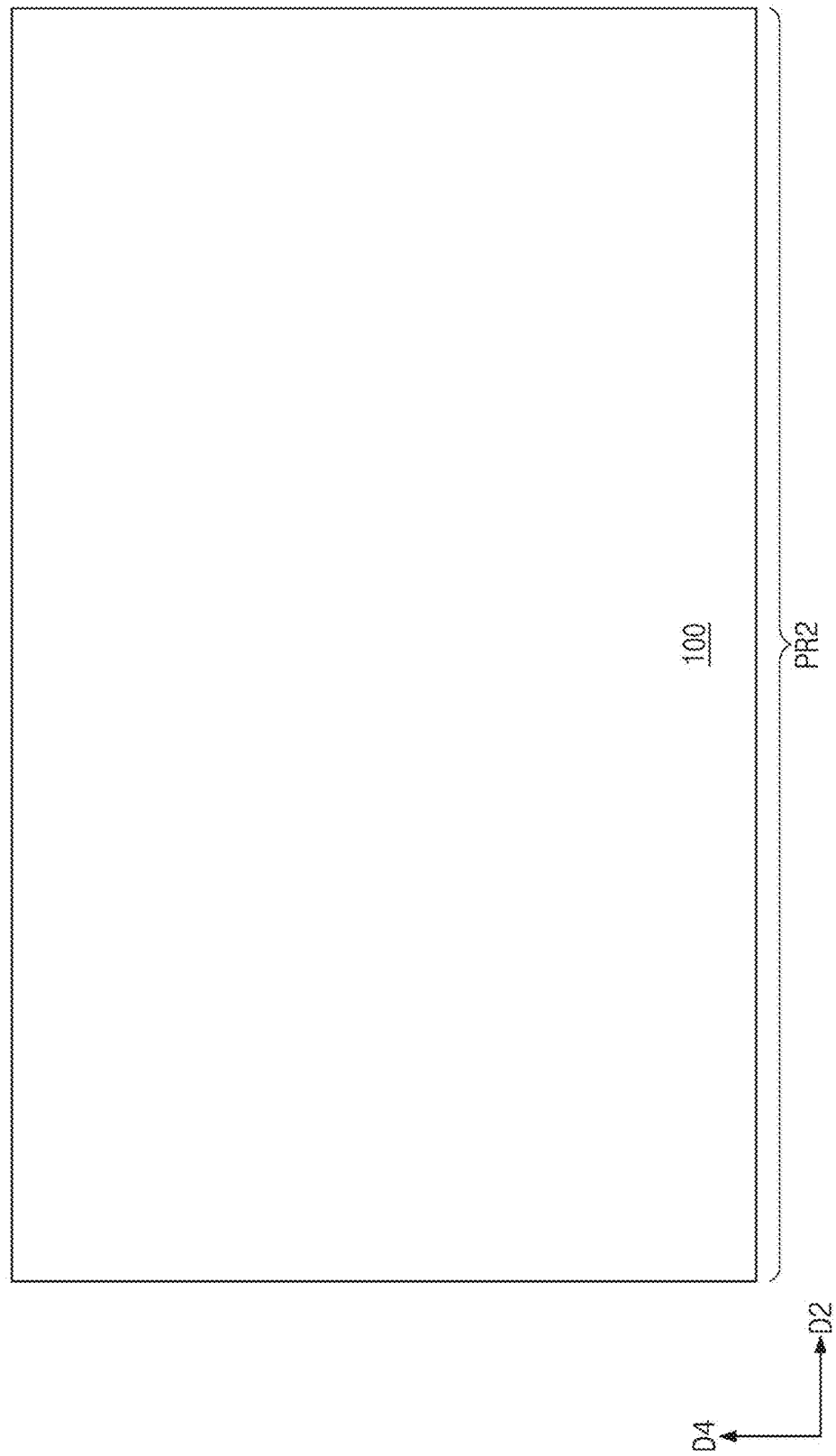
Figure 18A:
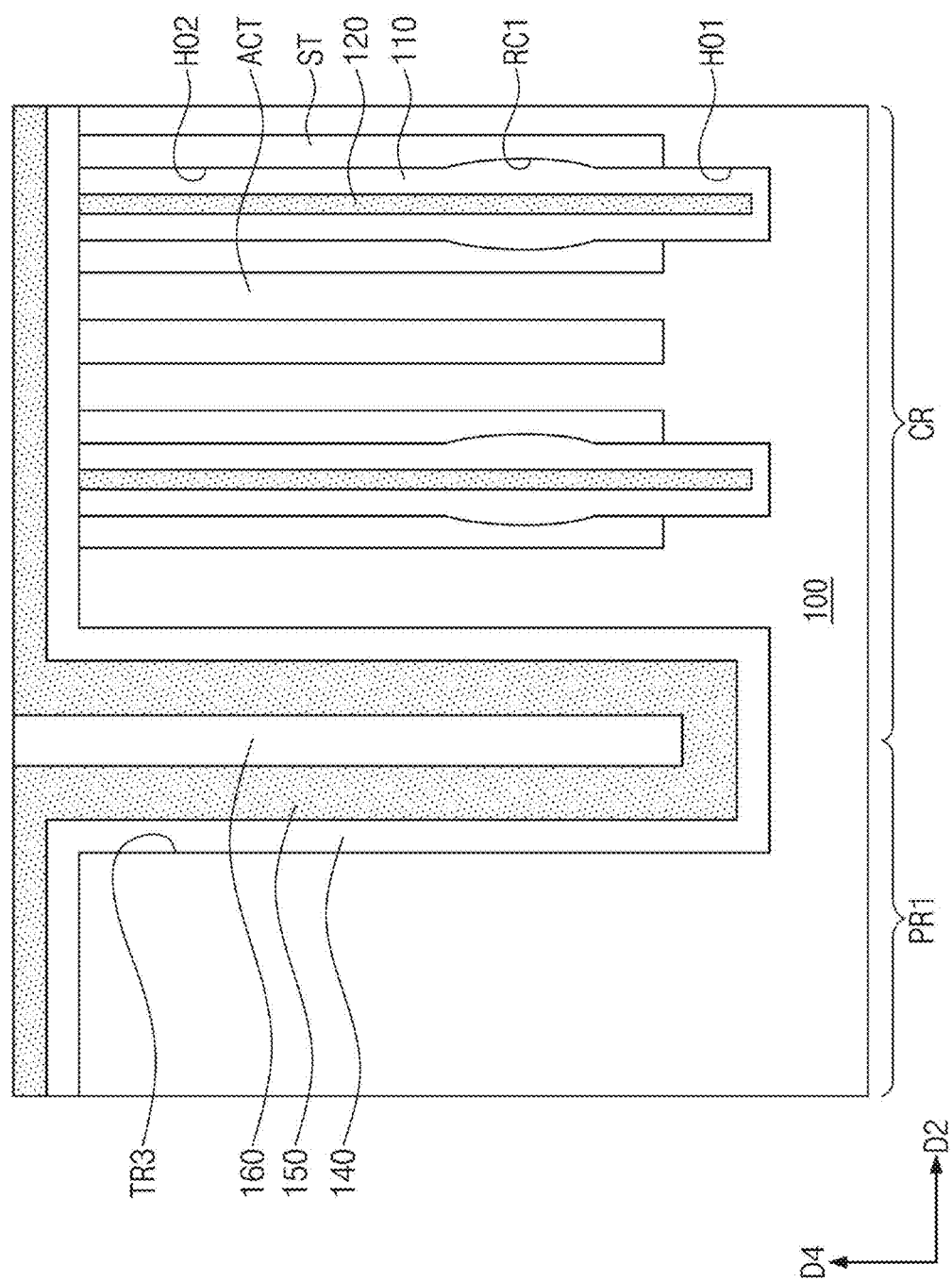
Figure 18B:
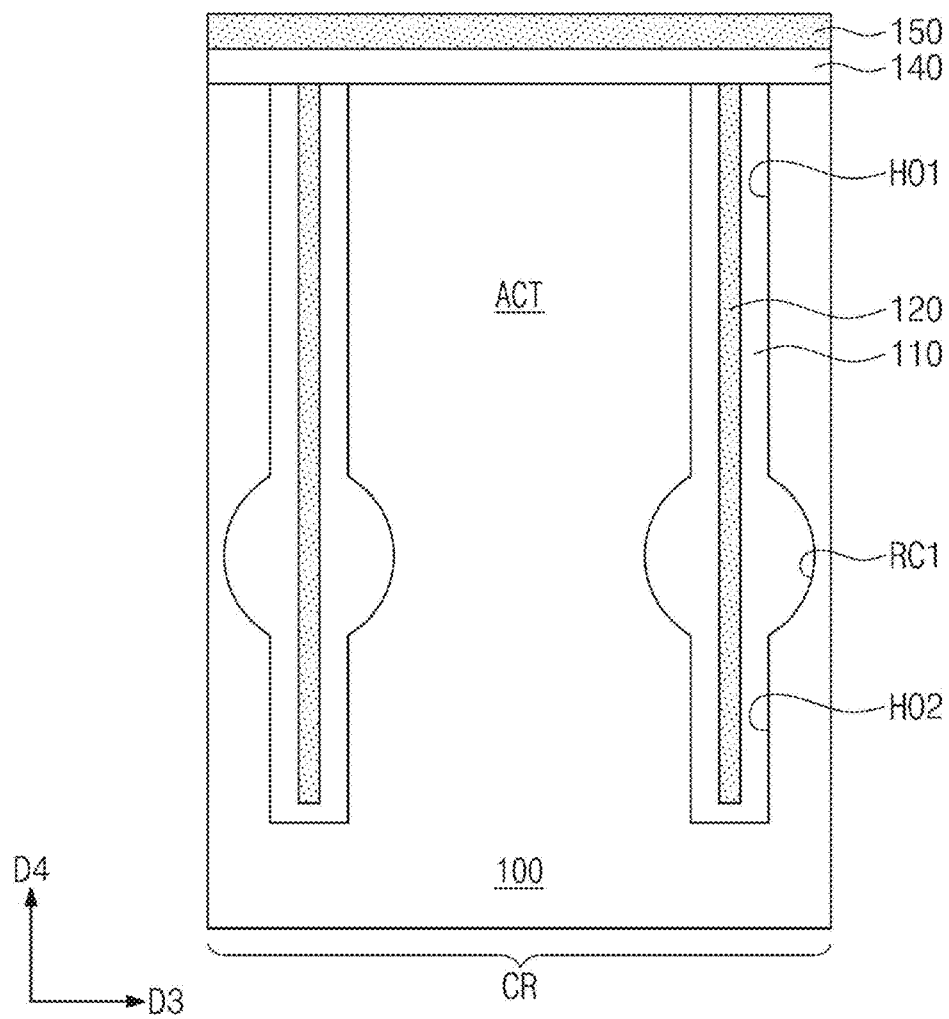

FIGS. 17A and 18A are sectional views illustrating a portion, where the cell region CR and the first peripheral region PR1 of FIG. 12 are connected to each other. FIGS. 17B and 18B are sectional views illustrating a region, in which the memory cell array MC of the cell region CR of FIG. 12 is provided. FIGS. 17C and 18C are sectional views illustrating the second peripheral region PR2 of FIG. 12.

For concise description, a previously described element may be identified by the same reference number without repeating an overlapping description thereof.

Referring to FIGS. 17A and 17B, the second holes HO2, the first recesses RC1, and the first holes HO1 may be formed in the cell region CR, and then, the first insulating layer 110 and the second insulating layer 120 may be formed to fill the second holes HO2, the first recesses RC1, and the first holes HO1.

Referring to FIGS. 18A and 18B, the third trench TR3 and the fourth trench TR4 may be formed, the third insulating layer 140, the fourth insulating layer 150, and the fifth insulating layer 160 may be formed to fill the third trench TR3, and the third insulating layer 140 may be formed to fill the fourth trench TR4.

As described with reference to FIGS. 6A to 11B, transistors constituting the memory cell array MC may be formed on the cell region CR. Transistors constituting the sense amplifier SA may be formed on the first peripheral region PR1. Transistors constituting the sub-word line driver SWD may be formed on the second peripheral region PR2.

In the method according to an example embodiment, the third trench TR3 may be formed after the formation of the first and second insulating layers 110 and 120, and thus, a recess may not be formed below the third trench TR3. Thus, the widths, in the second direction D2, of the third to fifth insulating layers 140, 150, and 160 filling the third trench TR3 may be uniform.

In the method according to an example embodiment, the fourth trench TR4 may be formed after the formation of the first and second insulating layers 110 and 120, and thus, a recess may not be formed below the fourth trench TR4. Thus, the third insulating layer 140 filling the fourth trench TR4 may have a uniform width in the second direction D2.

According to an example embodiment of the inventive concepts, a semiconductor device may include an insulating structure, and this may make it possible to improve electric characteristics of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
    active patterns extending in a first direction such that the active patterns are spaced apart from each other in the first direction;
    a device isolation layer defining the active patterns;
    an insulating structure between each of the active patterns and between the device isolation layer; and
    a gate structure on the insulating structure and extending in a second direction, the second direction crossing the first direction, the gate structure including an upper portion and a lower portion with a border defined therebetween, a level of the border of the gate structure being lower than an uppermost portion of the insulating structure such that the lower portion of the gate structure is enclosed by the insulating structure.

2. The semiconductor device of claim 1, wherein a largest width of the lower portion of the gate structure in the first direction is greater than a width of the border of the gate structure between the upper portion and the lower portion of the gate structure in the first direction.

3. The semiconductor device of claim 1, wherein a largest width of the upper portion of the gate structure in the first direction is greater than a width of the border of the gate structure between the upper portion and the lower portion of the gate structure in the first direction.

4. The semiconductor device of claim 1, wherein a level of a lowermost portion of the insulating structure is lower than a level of a lowermost portion of the device isolation layer.

5. The semiconductor device of claim 1, wherein the insulating structure comprises:
    a first insulating pattern downwardly extending from the lower portion of the gate structure; and
    a second insulating pattern enclosing the first insulating pattern, the second insulating pattern including different materials from the first insulating pattern.

6. The semiconductor device of claim 1, wherein the insulating structure comprises:
    a first portion enclosing the lower portion of the gate structure; and
    a second portion below the first portion, a width of the first portion of the insulating structure being greater than a width of the second portion of the insulating structure.

7. The semiconductor device of claim 6, wherein the width of the first portion of the insulating structure is greater in the first direction than in the second direction.

8. The semiconductor device of claim 1, wherein each of the active patterns comprises:
    active fins arranged in the first direction such that a lowermost portion of the active fins is higher than the uppermost portion of the insulating structure.

9. A semiconductor device, comprising:
    active patterns extending in a first direction such that the active patterns are spaced apart from each other in the first direction, the active patterns each including a first impurity region and second impurity regions, the second impurity regions spaced apart from each other in the first direction with the first impurity region interposed therebetween;
    a device isolation layer defining the active patterns;
    an insulating structure between each of the active patterns and between the device isolation layer;
    a gate structure on the insulating structure and extending in a second direction, the second direction crossing the first direction, the gate structure including an upper portion and a lower portion, the lower portion of the gate structure in the insulating structure;
    a bit line connected to the first impurity region and extending in a third direction, the third direction crossing the first and second directions; and
    contacts each connected to a respective one of the second impurity regions.

10. The semiconductor device of claim 9, wherein the insulating structure comprises:
    a first insulating pattern below the gate structure; and
    a second insulating pattern enclosing the first insulating pattern, the second insulating pattern including different materials from the first insulating pattern.

11. The semiconductor device of claim 10, wherein the second insulating pattern and the device isolation layer include a same material.

12. The semiconductor device of claim 10, wherein the first insulating pattern includes silicon nitride, and the second insulating pattern includes silicon oxide.

13. The semiconductor device of claim 9, wherein the insulating structure comprises:
   a first portion enclosing the lower portion of the gate structure; and
   a second portion below the first portion, a width of the first portion being greater than a width of the second portion.

14. The semiconductor device of claim 9, wherein largest widths of the upper portion and the lower portion of the gate structure in the first direction are greater than a width of a border of the gate structure between the upper portion and the lower portion in the first direction.

* * * * *